US007486878B2

(12) United States Patent
Chen et al.

(10) Patent No.: US 7,486,878 B2
(45) Date of Patent: Feb. 3, 2009

(54) OFFSET CORRECTION METHODS AND ARRANGEMENT FOR POSITIONING AND INSPECTING SUBSTRATES

(75) Inventors: Jack Chen, Fremont, CA (US); Andrew D Bailey, III, Pleasanton, CA (US); Ben Mooring, Austin, TX (US); Stephen J. Cain, Travis, TX (US)

(73) Assignee: Lam Research Corporation, Fremont, CA (US)

( * ) Notice: Subject to any disclaimer, the term of this patent is extended or adjusted under 35 U.S.C. 154(b) by 101 days.

(21) Appl. No.: 11/612,370

(22) Filed: Dec. 18, 2006

(65) Prior Publication Data

US 2008/0080845 A1 Apr. 3, 2008

Related U.S. Application Data

(60) Provisional application No. 60/827,671, filed on Sep. 29, 2006.

(51) Int. Cl.
G03B 15/00 (2006.01)
G03B 15/03 (2006.01)
G03B 17/00 (2006.01)
G01R 13/26 (2006.01)

(52) U.S. Cl. .......................... 396/5; 396/155; 396/419; 438/14

(58) Field of Classification Search ............... 396/4, 396/5, 155, 419, 556; 134/33; 438/14, 706; 356/237.2, 400, 500, 509, 448
See application file for complete search history.

(56) References Cited

U.S. PATENT DOCUMENTS 5,807,761 A 9/1998 Coronel et al. ............... 438/14
5,862,057 A 1/1999 Xia et al. .................... 364/488
2006/0141795 A1 6/2006 Negishi et al. .............. 438/706
2007/0209684 A1* 9/2007 Chen et al. .................... 134/33
2007/0211241 A1* 9/2007 Aizawa et al. ........... 356/237.2
2008/0081383 A1 4/2008 Chen et al. .................... 438/14

OTHER PUBLICATIONS

"International Search Report", Issued in PCT Application No. PCT/US07/78576; Mailing Date: Aug. 7, 2008.
"Written Opinion", Issued in PCT Application No. PCT/US07/78576; Mailing Date: Aug. 7, 2008.
"International Search Report", Issued in PCT Application No. PCT/US07/78578; Mailing Date: Aug. 8, 2008.
"Written Opinion", Issued in PCT Application No. PCT/US07/78578; Mailing Date: Aug. 8, 2008.

* cited by examiner

Primary Examiner—Melissa J Koval
(74) Attorney, Agent, or Firm—IP Strategy Group, P.C.

(57) ABSTRACT

A bevel inspection module for capturing images of a substrate is provided. The module includes a rotational motor, which is attached to a substrate chuck and is configured to rotate the substrate chuck thereby allowing the substrate to revolve. The module further includes a camera and an optic enclosure, which is attached to the camera and is configured to rotate, enabling light to be directed toward the substrate. The camera is mounted from a camera mount, which is configured to enable the camera to rotate on a 180 degree plane allowing the camera to capture images of at least one of a top view, a bottom view, and a side view of the substrate. The module yet also includes a backlight arrangement, which is configured to provide illumination to the substrate, thereby enabling the camera to capture the images, which shows contrast between the substrate and a background.

30 Claims, 20 Drawing Sheets

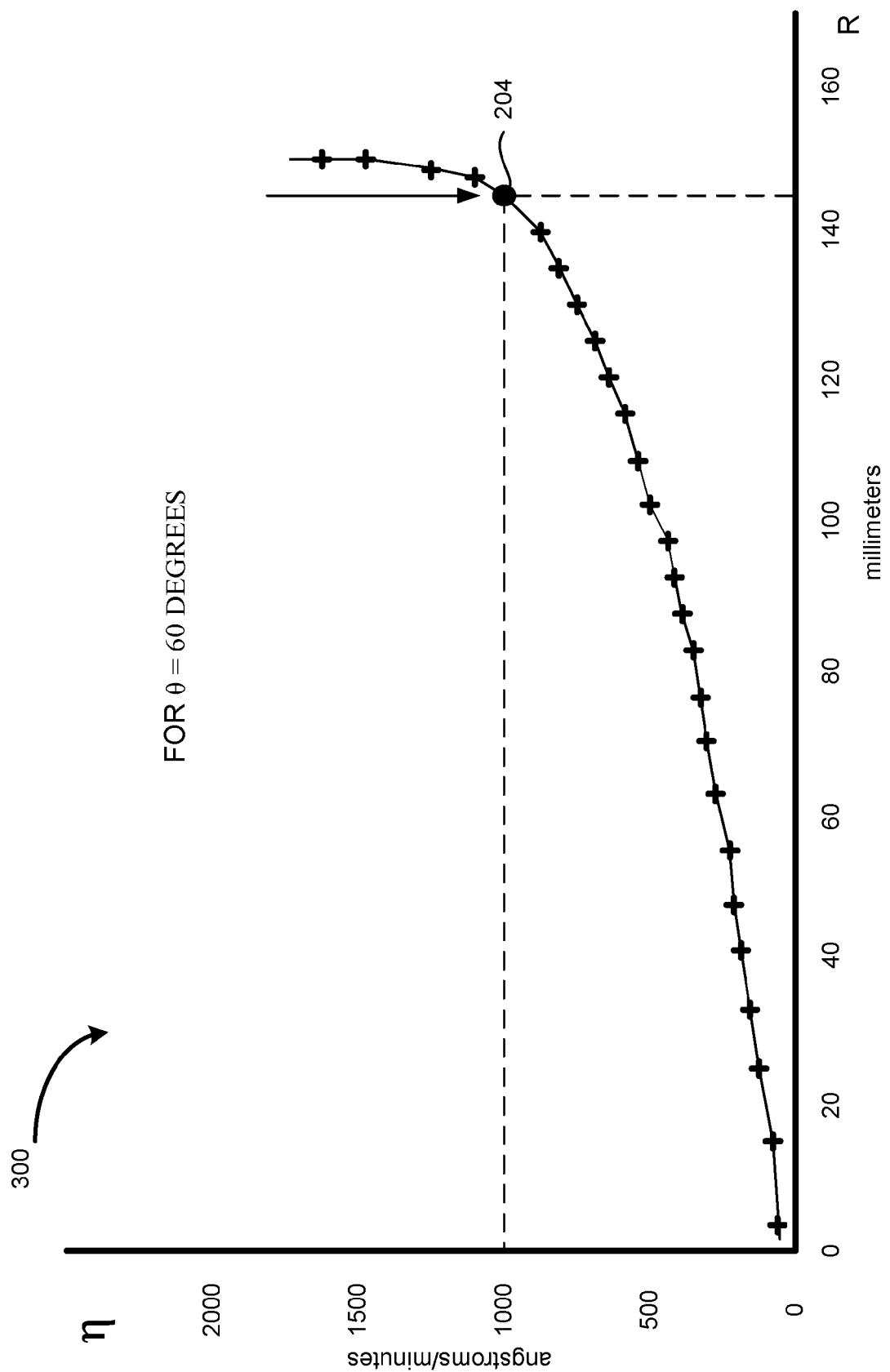

OFFSET CORRECTION METHODS AND ARRANGEMENT FOR POSITIONING AND INSPECTING SUBSTRATES

PRIORITY CLAIM

This application is related to and claims priority under 35 U.S.C. §119(e) to a commonly assigned provisional patent application entitled "Offset Correction Techniques For Positioning and Inspecting Substrates," by Chen et al., Application Ser. No. 60/827,671 filed on Sep. 29, 2006, all of which are incorporated herein by reference.

BACKGROUND OF THE INVENTION

Advances in plasma processing have facilitated growth in the semiconductor industry. Generally speaking, a plurality of semiconductor devices may be created from dies cut from a single processed substrate. To process a substrate, the substrate may be placed on top of a substrate chuck within a plasma processing chamber. The positioning of the substrate on the substrate chuck may determine which portion of the substrate may be processed to form devices.

Methods are available for aligning a substrate to the center of a substrate chuck. In an example, sensors may be placed in a processing module to determine the positioning of a substrate in regard to a substrate chuck. In another example, an alignment fixture, such as a guided robotic arm may be employed to position the substrate in alignment with the substrate chuck. Although aligning to a hardware center (e.g., center of the substrate chuck) may be performed with some precision, alignment to the hardware center may not always equate to an alignment to the process center.

As discussed herein, the hardware center refers to the center of a hardware, such as a substrate chuck. Also as discussed herein, the process center refers to the focal center of the plasma process. Ideally, at any given radial distance from the focal center, the process result (e.g., the etch rate) remains the same. For example, at a distance of 100 mm from the process center, it is expected that the etch rate remains substantially constant as one follows around a circle having a radius of 100 mm from this focal process center. Due to chamber configuration peculiarities, the process center may not always be the same as the hardware center. As a result, basing alignment on the hardware center alone may cause misalignment during substrate processing. As manufacturers continue to strive to improve yield, efforts are continually made to more precisely center the substrate over the process center during plasma processing to minimize device defect caused by substrate misalignment.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 shows, in an embodiment, a simple graph illustrating an etch profile for an orientation.

SUMMARY

Figure 1:
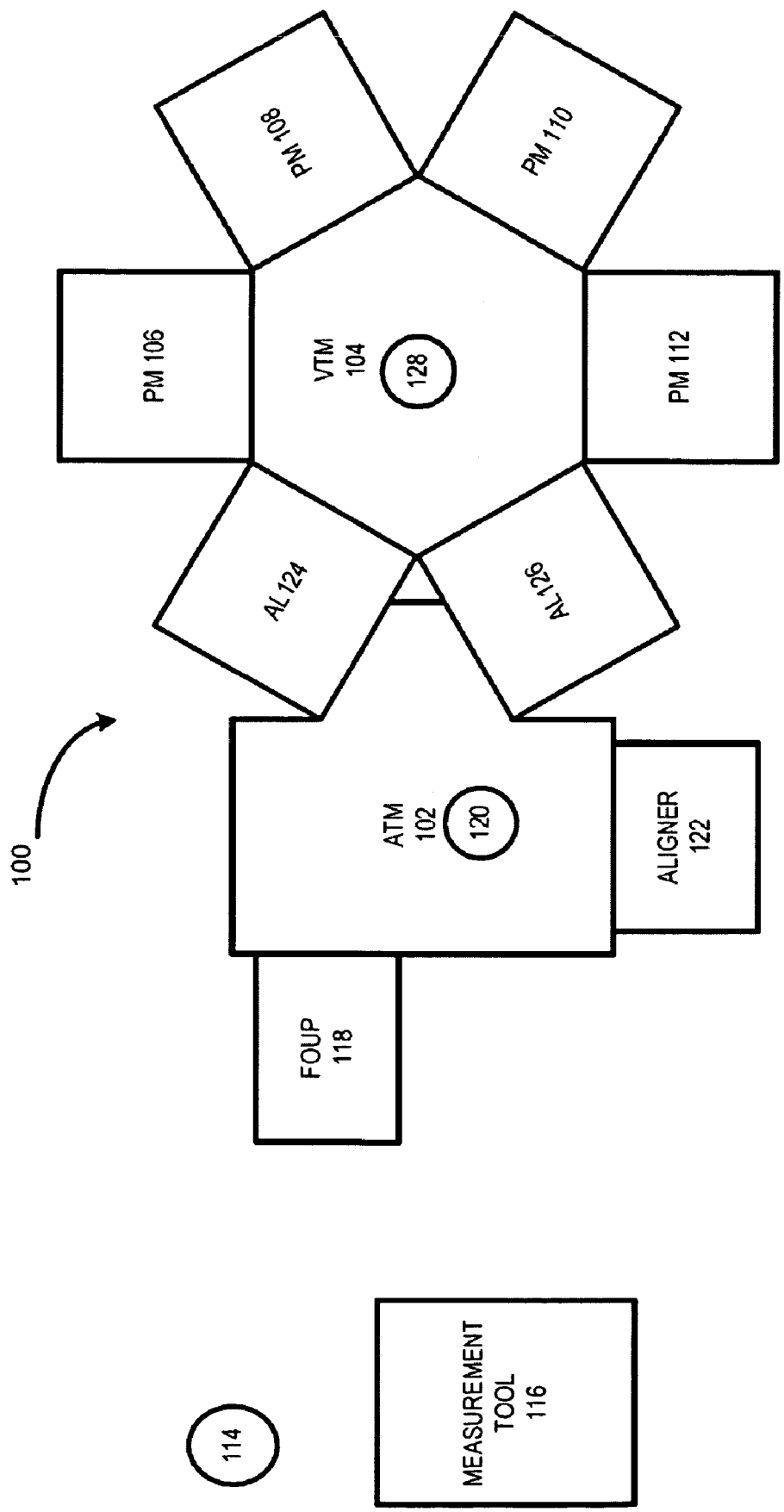
FIG. 1 shows, in an embodiment, a block diagram of an overview of a typical substrate process system.

The invention relates, in an embodiment, to a bevel inspection module for capturing images of a substrate. The module includes a substrate chuck for supporting the substrate. The module also includes a rotational motor, which is attached to the substrate chuck and is configured to rotate the substrate chuck thereby allowing the substrate to revolve. The module further includes a camera. The module also includes an optics enclosure, which is attached to the camera and is configured to rotate, enabling light to be directed toward the substrate. The module yet also includes a camera mount from which the camera is installed. The camera mount is configured to enable the camera to rotate on a 180 degree plane allowing the camera to capture the images, which includes at least one of a top view, a bottom view, and a side view of the substrate. The module yet further includes a backlight arrangement, which is configured to provide illumination to the substrate, thereby enabling the camera to capture the images, which shows contrast between the substrate and a background.

In another embodiment, the invention relates to a method for calculating a process center of a chuck in a processing chamber. The method includes capturing images of edges of a processed substrate by employing a bevel inspection module. The method also includes measuring a set of distances from the edges of the processed substrate for an interference fringe. The set of distances is being measured at a set of orientations. The method further includes generating an off-centered plot, which is a graphical representation of the set of distances versus the set of orientations. The method yet also includes calculating the process center by applying a curve-fitting equation to the off-centered plot.

In yet another embodiment, the invention relates to an image processing method for determining a process center for a chuck in a processing chamber. The method includes capturing images of a processed substrate by employing a bevel inspection module. The method also includes filtering the images to remove noises from the images and to accentuate edges of the processed substrate. The method further includes measuring a set of gaps from the edges of the processed substrate for an interference fringe. The set of gaps is being measured at a set of orientations. The method yet also includes generating an off-centered plot, which is a graphical representation of the set of gaps versus the set of orientations. The method yet further includes calculating the process center by applying a curve-fitting equation to the off-centered plot.

These and other features of the present invention will be described in more detail below in the detailed description of the invention and in conjunction with the following figures.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In the following disclosure, etching is discussed as the application for which the centering techniques can be employed to improve. It should be kept in mind, however, that the centering techniques disclosed herein can apply to any other type of processing (such as, for example, deposition). Further, this technique is applicable for any application where the process is concentric (uniform and/or non-uniform).

In accordance with embodiments of the present invention, there is provided a circular constant etch rate method for calculating the process center for a substrate chuck of a processing chamber. In embodiments of the invention, a substrate offset (i.e., the offset from the chuck's hardware center to the chuck's process center) may be inferred from etch rate measurements made on a test substrate that has been geometrically centered over the chuck during processing. With the calculated substrate offset, a robotic arm within a transfer module may be programmed with the coordinates of the chuck's process center to facilitate centering of subsequent substrates over the chuck's process center to enable processing with improved uniformity.

Generally, a robotic arm may be employed to place a substrate on the hardware center of a substrate chuck. However, as mentioned above, the hardware center and the process center may not always be the same due to peculiarities of a given tool. If the substrate can be more accurately centered on the process center, process uniformity is improved, rendering it possible to obtain satisfactory process results closer to the substrate edge and to use more of the substrate to create dies for devices. In the prior art, the method of alignment using hardware center may be an open loop alignment, which usually does not allow for feedbacks of offset signal. Unlike the prior art, the method of employing process center enables a close loop feedback of the substrate position, thus allowing for the control of the process center.

Embodiments of the invention provide a method for determining a process center by extrapolating data from a set of measurements made on a substrate that has been geometrically centered over the chuck's hardware center during processing. In an embodiment, a set of pre-processing measurement data points for a substrate may be collected prior to processing. In an embodiment, a set of post-processing measurement data points for the measurement locations on the same substrate may be collected after processing.

By calculating the difference between the pre and post-processing measurements for each data point, the amount of a film layer that has been removed may be determined. In other words, the etch depth may be calculated from the set of pre and post-processing measurements. Although the set of pre-processing measurement data points is not necessary in calculating the thickness of a substrate, a more accurate etch depth for each data points may be calculated by including both pre and post-processing measurements. As an alternative to obtaining pre-processing measurement data points, assumptions may be made regarding the pre-measurement thickness from the specification data furnished by the raw substrate manufacturer, for example.

Consider the situation wherein, for example, etch rates are being calculated to determine the substrate offset. An etch rate for each data point may be calculated by dividing the etch depth by the substrate process time, in an embodiment. In this document, various implementations may be discussed using etch rate. This invention, however, is not limited to etch rate and may be employed with etch depth.

In an embodiment, the pre and post-processing measurements may also include the radius for each data points (defined herein as the distance measured along the line that joins the data point location and the geometric center of the substrate). In an example, data point 1 is 148.2 millimeter from the center of the substrate. Since an etch rate has been calculated for each data point, the radius (R) value for each data point may now be associated with each etch rate. Furthermore, the orientation for each data point may also be determined. As the term is employed herein, the orientation refers to the angle offset from a reference radius line. Thus, a data point may be characterized by one or more of the following: its pre-processing etch depth, its post-processing etch depth, its calculated etch rate, its radial distance from the substrate's geometric center, and its orientation.

In an embodiment, an etch profile may be determined for each orientation ($\theta$). As discussed herein, orientation ($\theta$) refers to an angle from 0 degree to 360 degrees on a substrate from a fixed reference radial line. Examples of orientation include, but are not limited to, 0 degree, 45 degrees, 90 degrees, 180 degrees, 270 degrees, and the like.

Furthermore, one or more substantially concentric circles may be determined for each etch rate, in an embodiment. In an example, for an etch rate of 1000 angstroms per minute, a plurality of data points having an etch rate of 1000 angstroms per minute may be determined on the substrate. These data points form a substantially concentric circle around the processing center of the substrate. Note that if the substrate had been centered over the processing center of the chuck, i.e., if the substrate's geometric center had coincided with the chuck's processing center during processing, the concentric circles for the various etch rates tend to be centered around the geometric center of the substrate. However, since the substrate's processing center is unknown at this point, and the test substrate had been centered over the robot's geometric center the center for the concentric circles for the various etch rates would be offset from the geometric center of the substrates. Embodiments of the invention take advantage of this fact to calculate the offset between the chuck's process center and the robot's center.

In an embodiment, each substantially concentric circle on the substrate for a given etch rate may also be represented as a substantially sinusoidal curve graphically. In other words, for a given etch rate, the distance between the location on the radius line where that given etch rate is found and the substrate's geometric center varies sinusoidally as one rotates through 360 degrees around the substrate's geometric center. Each point on the off-centered plot for a given position that matches the given etch rate represents a radial distance (E) from the substrate's geometric center for a specific orientation ($\theta$).

In an embodiment, an off-centered plot may be created for each etch rate. The substrate offset may then be calculated by knowing at least one off-centered plot. From an off-centered plot, a curve-fitting equation (e.g., Fourier Series Equation from Fourier Transform, Least Square Fit, etc.) may be employed to mathematically calculate the offset between the process center from the hardware (i.e., geometric) center. Once the substrate offset has been determined, the robotic arm of the vacuum transfer module may be programmed with the new coordinates for the process center of the substrate chuck for a processing chamber.

The features and advantages of the invention may be better understood with reference to the figures and discussions that follow. FIG. 1 shows, in an embodiment, a block diagram of an overview of a typical substrate process system from which from which process center may be determined. A plasma processing system 100 may include a plurality of substrate-holding locations that enable a substrate to be processed as it moves from an atmospheric transfer module 102 to a vacuum transfer module 104 to one or more process modules (106, 108, 110, and 112) and ultimately back out of plasma processing system 100.

Consider the situation wherein, for example, a substrate is being processed. Prior to being processed, the thickness of a substrate 114 at various locations on the substrate may be measured. Substrate 114, which may include a refractive film layer, may be measured by a metrology tool 116. In measuring the thickness of substrate 114, a plurality of data points at various measurement locations may be collected. In an embodiment, two or more data points may be collected. In another embodiment, about 100-200 data points may be taken at different locations on substrate 114.

Once pre-processing measurements have been completed, substrate 114 may be placed on a front opening unified pod (FOUP) 118. A robotic arm 120 within atmospheric transfer module 102 may move substrate 114 to an aligner 122. At aligner 122, substrate 114 may be centered properly over the chuck's geometric center (as would be the case for the test substrate since the process center is not yet ascertained). Once centered, robotic arm 120 may move substrate 114 to one of the airlock modules (AL 124 and AL 126). The ability of the airlock modules to match the environment between atmospheric transfer module 102 and vacuum transfer module 104 allows substrate 114 to move between the two pressurized environments without being damaged.

From an airlock module, such as AL 124, substrate 114 may be moved into one of the process modules (106, 108, 110, and 112) by a robotic arm 128 within vacuum transfer module 104. Once substrate 114 has been processed (e.g., etching), robotic arm 128 may move substrate 114 from vacuum transfer module 104 through atmospheric transfer module 102 to FOUP 118.

From FOUP 118, substrate 114 may be moved to metrology tool 116 to be measured. In measuring the thickness of substrate 114 after processing, some or all of the same data point locations that have been measured prior to processing may be measured again after substrate processing. In an example, if 120 data points have been collected at 120 locations during the pre-processing measurements then the data for at least the same 120 locations may be collected again during the post-processing measurements.

Figure 2A:
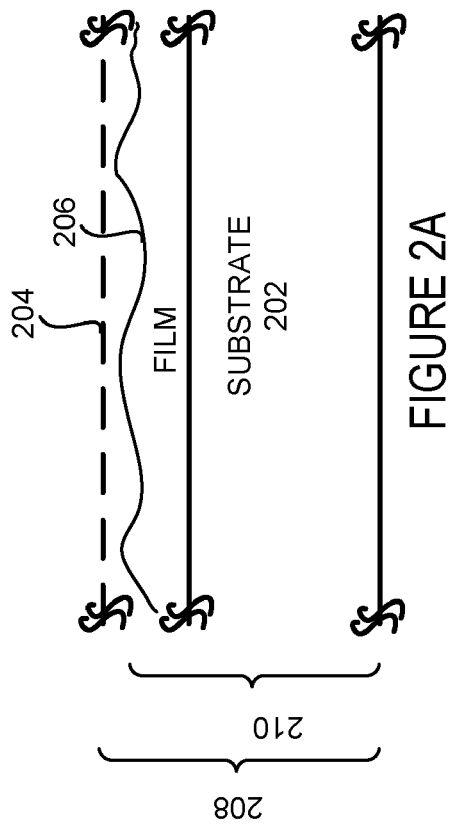
FIG. 2A shows, in an embodiment, a substrate before and after processing.

FIG. 2A shows, in an embodiment, a substrate before and after processing. Substrate 202 may have a film layer 204. Film layer 204 may be, for example, a refractive material that may allow a metrology tool to measure the thickness of the substrate. Prior to processing, the metrology tool may measure from the bottom of substrate 202 to film layer 204 (i.e., distance 208).

Unless there is a substantial defect in the raw substrate, the pre-processing measurements for each data points on substrate 202 tend to be fairly similar. In an example, the thickness of the substrate at data point 1 may be almost the same thickness of the substrate at data point 2, with the minor difference in thickness being attributable to the slight variability introduced during the manufacturing of the raw substrate. Prior to processing, the substrate tends to be substantially flat and the film layer tends to be distributed substantially even across the surface of the substrate.

In an embodiment, pre-processing measurements may be bypassed if the film layer thickness on the substrate is assumed to be evenly distributed. Due to potential thickness differences that may exist in a substrate before and after a film layer is added, pre-processing measurements may allow the technique to take into account for the differences in the thickness of the substrate at different locations on the substrate, in an embodiment.

After processing, part of film layer 204 may be etched from substrate 114. The film layer 204 is now shown as etched film layer 206. As a result of the processing, the thickness of the film layer now varies at different locations on the substrate. Reference number 210 represents the new thickness of substrate 202 at a given location on the substrate, for example. Post-processing measurements, which may be performed after substrate processing, may measure the new thickness of the substrate at various locations.

Figure 2B:
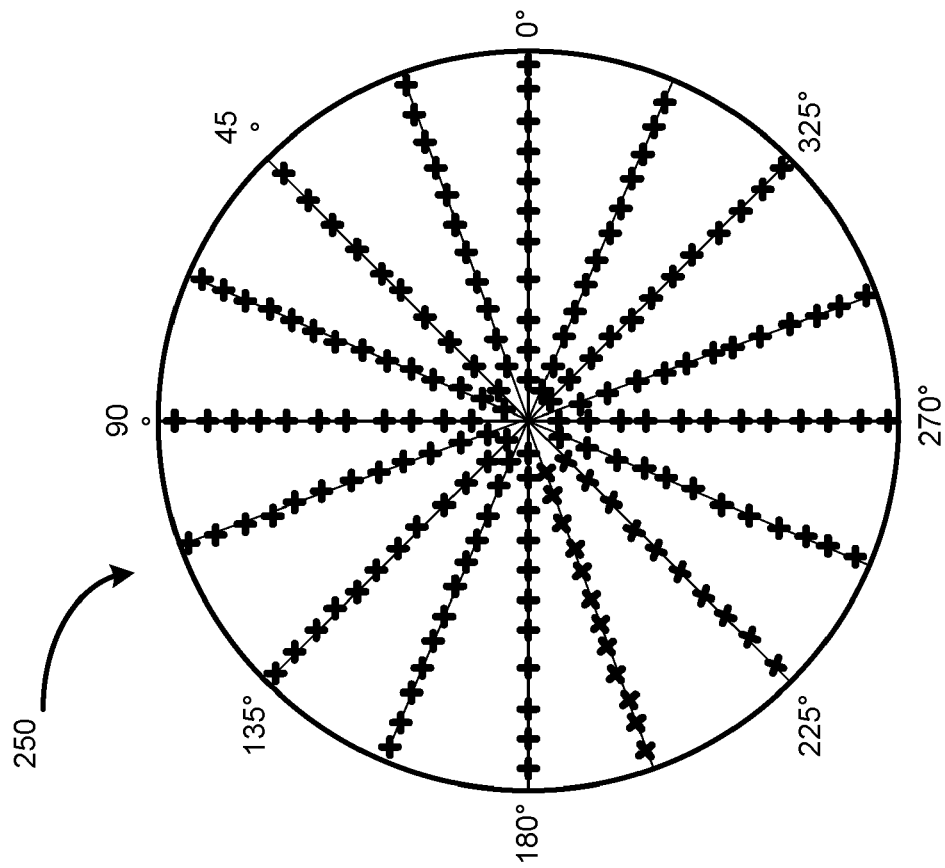
FIG. 2B shows, in an embodiment, a simple diagram illustrating the different data points that may be taken. Data points may be taken at various angles and distance from substrate center.

FIG. 2B shows, in an embodiment, a simple diagram illustrating the different data points that may be measured. A substrate view 250 shows a plurality of data points at different orientations (e.g., 0 degree, 45 degrees, 90 degrees, etc.). In both pre and post-processing measurements, thickness data for the same substrate locations may be collected. In an embodiment, the collection of data points may be performed manually. In another embodiment, a scan pattern may be identified and employed to perform pre and post-processing measurements.

In an embodiment, etch depth may be calculated from the pre and post-processing measurements. As discussed herein, the term etch depth refers to the portion of the film layered substrate that has been etched. In other words, etch depth is the difference between the pre-processing measurement data and the post-processing measurement data for a given substrate location.

In an embodiment, the etch depth may be represented as an etch rate by dividing the process duration time of the substrate into the etch depth. In an example, a substrate location may have a pre-processing measurement of about 0.5 millimeters. Once the substrate has been processed, the thickness of the substrate at the same location is now 0.375 millimeters. Given that the etch depth is the difference between the pre and post-processing measurements, the etch depth at a given location (e.g., orientation of 0 degree, radius of 115 mm) is 0.125 millimeters. If the process time for substrate 114 is 2 minutes, then the etch rate is 0.0625 angstroms per minute for that location. Once the etch rate has been determined, each of the data points on the substrate may now be associated with an etch rate.

Figure 2C:
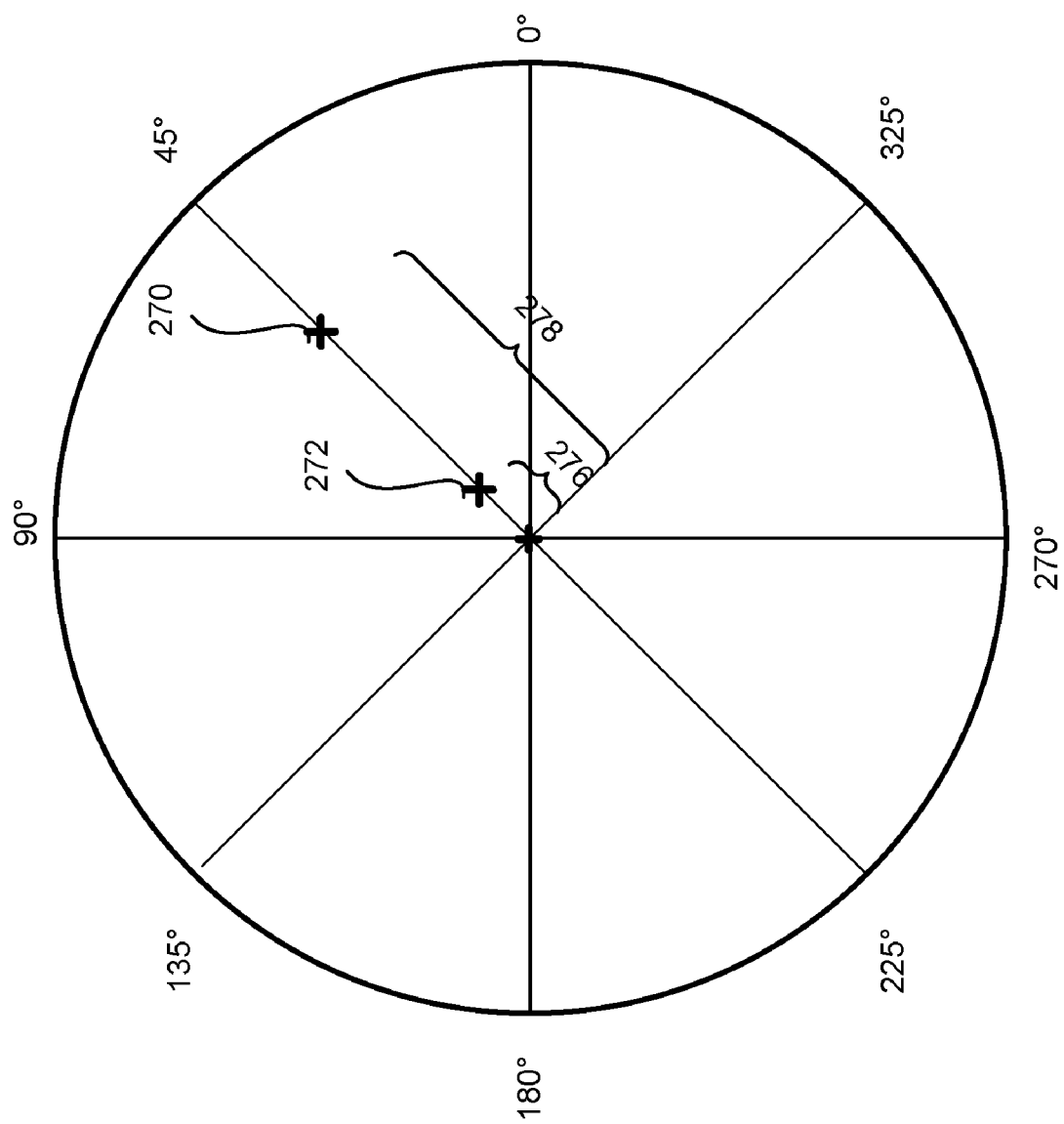
FIG. 2C shows, in an embodiment, a radius measurement for each data point.

In an embodiment, besides measuring the thickness of a substrate, a metrology tool may also measure the radial distance from the substrate geometric center for each data point collected. FIG. 2C shows, in an embodiment, a radius measurement for each data point. In an example, a substrate view 260 shows data points 270 and 272. Associated with data point 270 is radius 278 and associated with data point 272 is radius 276. For each data point that may be collected, a radial distance from the substrate geometric center (which coincides with the hardware center for the test substrate centering geometrically on the chuck substrate) may be measured.

The location of a particular data point on the chuck may be specified by its radius and its orientation from a reference radius line. FIG. 3 shows, in an embodiment, a simple graph illustrating an etch profile for an orientation. As can be seen from FIGS. 2B and 2C, an orientation may have a plurality of etch rates that vary according to the distance from the substrate's geometric center. A graph view 300 shows a plurality of etch rates (η) plotted versus a plurality of radiuses (R) for orientation (θ) of 60 degrees. For each orientation (e.g., 0 degree, 45 degrees, 90 degrees, etc.) an etch profile (e.g., etch rate profile, etc.) may be plotted, in an embodiment.

Once various etch profiles has been established for various orientation angles, a substantially concentric circle may be determined for each etch rate. In an embodiment, a linear interpolation or cubic spline may be performed to determine the radius for data points having a given etch rate. In an example, an etch rate of 1000 angstroms per minute at an orientation of 60 degrees may have a radius of 145 millimeter (as seen in FIG. 3). The same etch rate at a different orientation may have a different radius as seen in FIG. 3. For each orientation, a radius measurement may be determined for the same etch rate of 1000 angstrom per minute.

Figure 4:
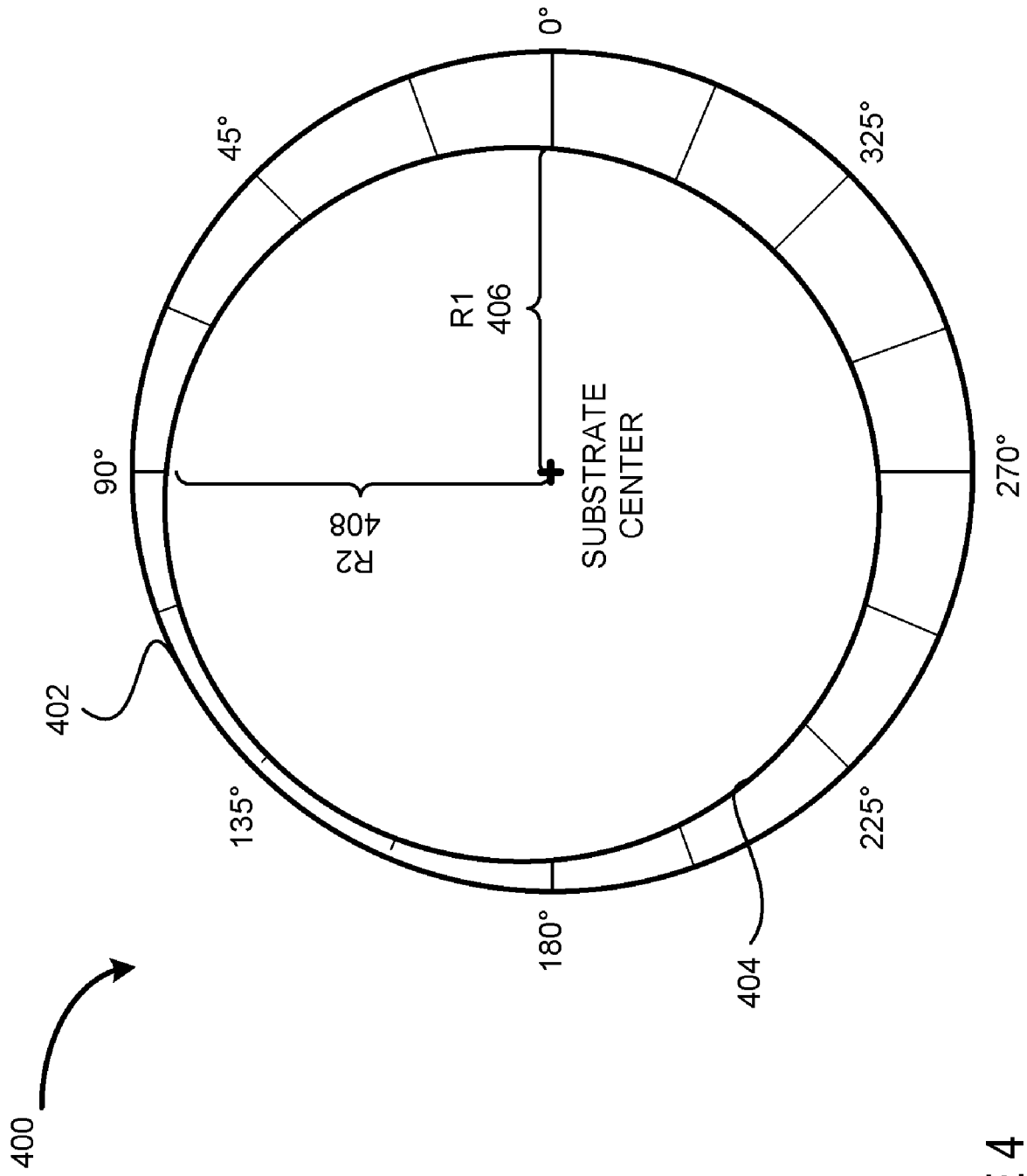
FIG. 4 shows, in an embodiment, a simple diagram of a substantially concentric circle for a constant etch rate.

FIG. 4 shows, in an embodiment, a simple diagram of a substantially concentric circle for a constant etch rate. A substrate view 400 shows a substrate 402 and a concentric circle 404. For each etch rate, a plurality of radiuses (e.g., R1 406 and R2 408), which may have been extrapolated from a plurality of etch profiles (as seen in FIG. 3) may be employed to create a substantially concentric circle 404, in an embodiment.

Figure 5:
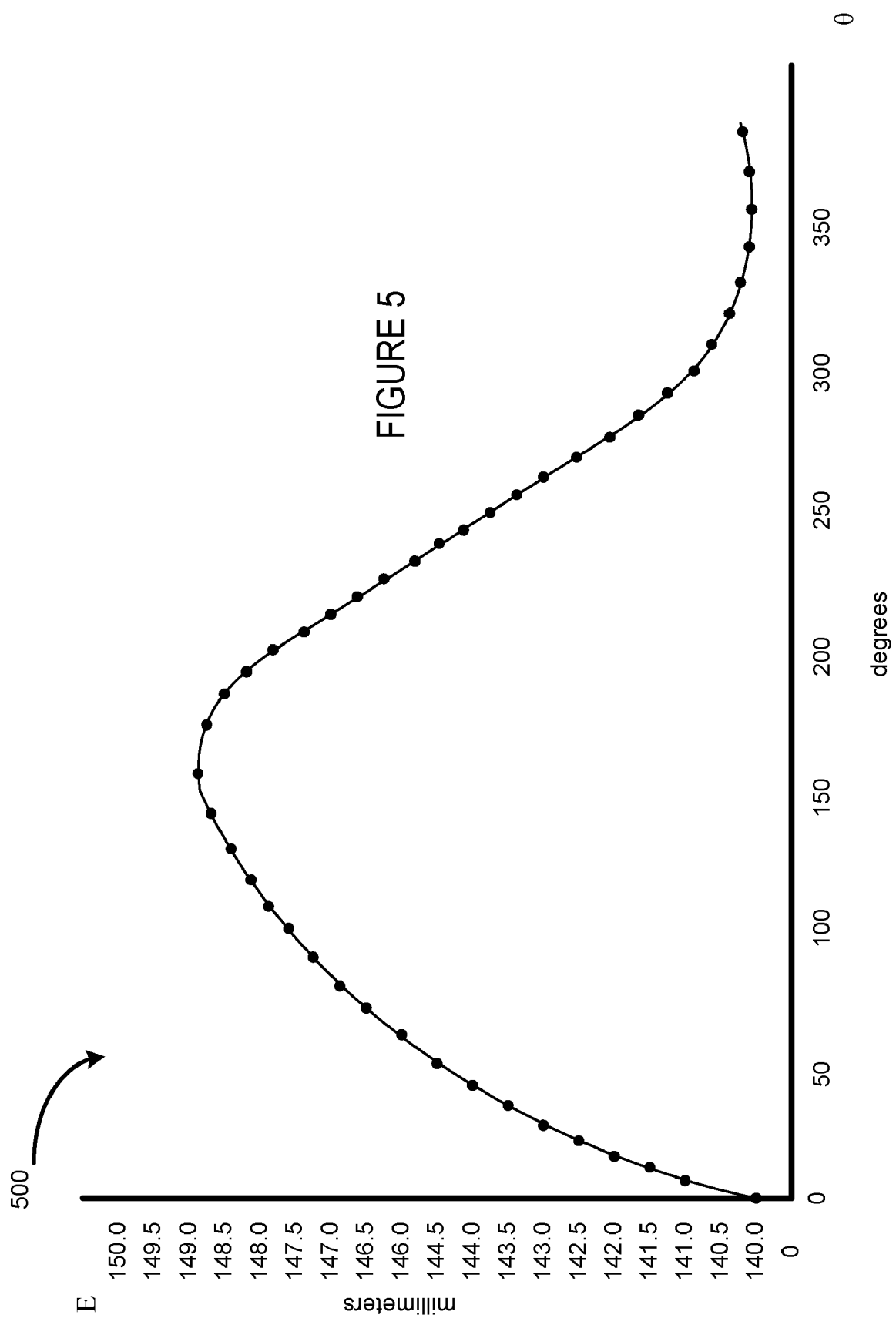
FIG. 5 shows, in an embodiment, a graph showing the radial location versus azimuthal direction of a sufficiently off-centered constant etch rate circle.

FIG. 5 shows, in an embodiment, a graph showing the radial location versus azimuthal direction of a sufficiently off-centered constant etch rate circle. Graph view 500 shows a plurality of radiuses (E), representing the distance between the substrate location having such etch rate and the substrate's geometric center, plotted versus a plurality of orientations (θ) for a constant etch rate (e.g., 1000 angstroms per minute). Note that if the substrate's geometric center had coincided with the substrate's process center, the off-centered plot (e.g., that shown in FIG. 5) would have been substantially flat.

For each etch rate, an off-centered plot similar to FIG. 5 may be plotted. The off-centered plot, in an embodiment, may have a substantially sinusoidal shape. In an embodiment, a process center may be calculated from at least one off-centered plot.

Once an off-centered plot has been plotted, a curve-fitting equation (e.g., Fourier Series Equation from Fourier Transform, Least Square Fit, etc.) may be employed to determine the parameters for Equation 1.

$$E_n(\theta, \gamma, R) = E_{avg} + \Delta c \cos(\theta - \phi_1) + \Delta c_2 \cos(2\theta - \phi_2) \quad \text{[EQUATION 1]}$$

| Parameter | Description |
| --- | --- |
| $E_{avg}$ | average distance from a substrate center for a constant etch rate |
| $\Delta c \cos(\theta - \phi_1)$ | first harmonics - deviation as a function of an orientation |
| $\Delta c_2 \cos(2\theta - \phi_2)$ | second harmonics |
| $\Delta c$ | distance measurement between 2 centers |
| R | radius |
| θ | orientation |
| φ | angle of which the offset is in |

Figure 6:
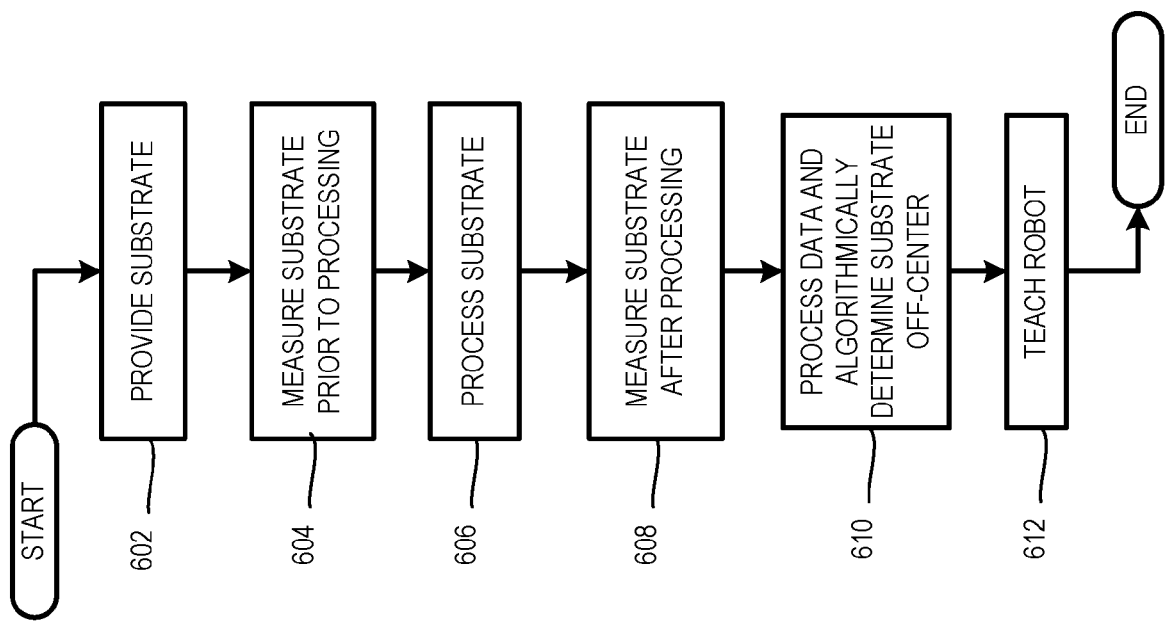
FIG. 6 shows, in an embodiment, a simple flow chart illustrating the steps for calculating a process center for a substrate chuck.

FIG. 6 shows, in an embodiment, a simple flow chart illustrating the steps for calculating a process center for a substrate chuck.

At a first step 602, a substrate is provided. In an embodiment, the substrate may have a film layer (e.g., refractive film layer).

At a next step 604, the substrate may be measured prior to processing. In an embodiment, the thickness of the substrate with film layer may be measured at a plurality of data points. Instead of manually measuring the data points, a scan pattern may be employed to collect the data points.

At a next step 606, the substrate may be processed in a plasma processing chamber while the substrate is geometrically centered over the chuck's geometric center. In an embodiment, the substrate may not have to be entirely processed. In an example, the substrate may only have to be processed for a duration that is sufficient to remove a portion of the film layer.

Once the substrate has been removed from the plasma processing chamber, at a next step 608, the substrate may be measured. In an embodiment, the same scan pattern that may have been employed in collecting the pre-processing measurements may be utilized to collect the post-processing measurements.

Figure 7:
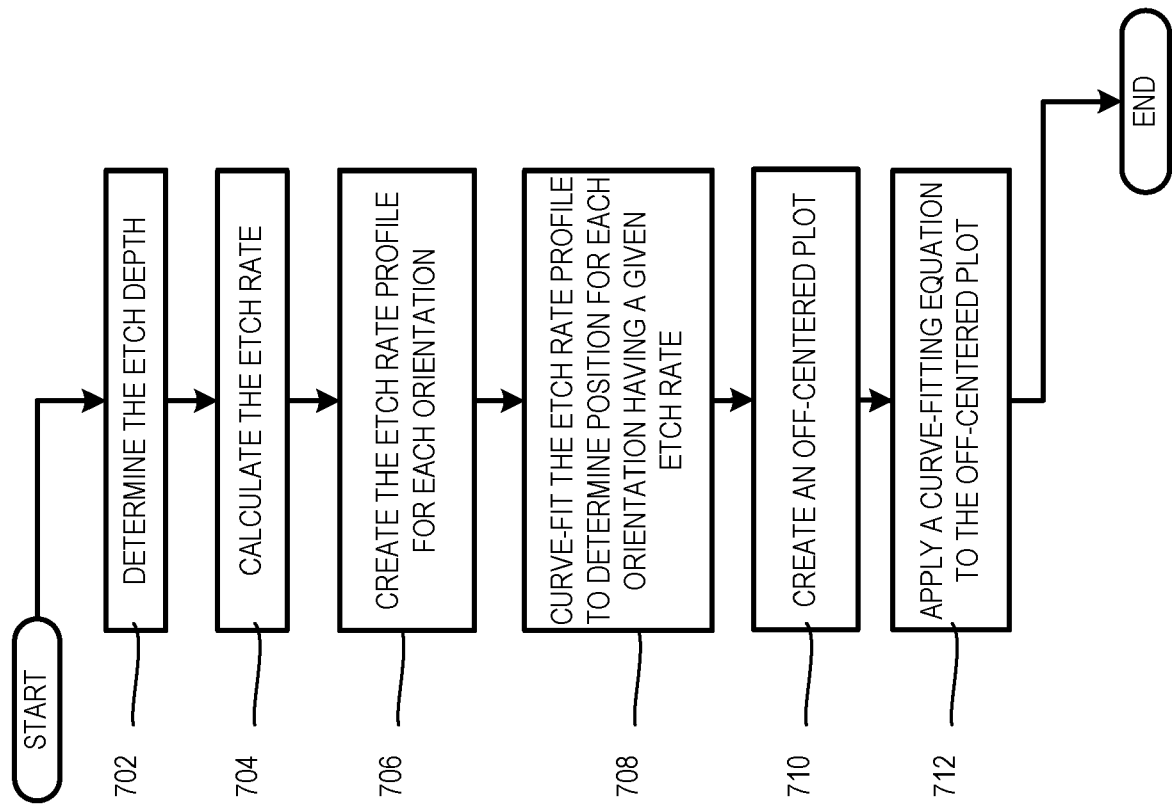
FIG. 7 shows, in an embodiment, the algorithm for determining the process center.

At a next step 610, the data points may be processed and the process center may be algorithmically determined. FIG. 7 shows, in an embodiment, an algorithm for determining the process center.

At a first step 702, the etch depth for each data point may be calculated. To calculate the etch depth, the pre-processing measurement of the measurement location for a data point may be subtracted from the post-processing measurement.

At a next step 704, the etch rate for each data location may be calculated. To calculate the etch rate, the etch depth of a data point may be divided by a substrate process time.

At a next step 706, an etch profile (e.g., etch rate profile, etc.) may be created for each orientation. In an example, the etch rate for each data point at a specific orientation may be plotted to create an etch profile.

At a next step 708, by curve-fitting the etch profile, a position (E) may be determined for each orientation having a given etch rate.

An off-centered curve may be plotted for each etch rate, at a next step 710. In an example, the radius for an etch rate at a specific orientation may be extrapolated from the etch profile. Once a radius at a constant etch rate has been extrapolated for each etch profile, a substantially sinusoidal off-centered plot may be generated.

At a next step 712, a curve-fitting equation (e.g., Fourier Series Equation from Fourier Transform, Least Square Fit, etc.) may be employed to determine the parameters for the substrate offset. Note that if the substrate's geometric center had coincided with the chuck's process center, the off-centered plot (e.g., that shown in FIG. 5) would have been substantially flat. Curve fitting as a mathematical approach and various techniques therefor are known to those skilled in the art.

Referring back to FIG. 6, once the parameters have been determined, at a final step 612, the parameters may be taught to the robotic arm in the transfer module (e.g., atmospheric transfer module, vacuum transfer module, etc.). As a result, the robotic arm may now have the correct coordinates to offset a subsequent substrate on a substrate chuck such that the substrate may be centered over the chuck's process center during processing.

It should be appreciated that although Equation 1 and the figures herein follow a particular example implementation of the invention, the invention may be practiced in various equivalent ways in accordance with the circular constant etch rate method. As long as process result measurements can be obtained from a geometrically-centered test substrate to facilitate the creation of one or more constant etch rate concentric circles, various mathematical techniques may be applied to determine the offset between the center of the concentric circle(s) and the geometric center of the chuck (which coincides with the geometric center of the substrate for a test substrate that is geometrically centered over the chuck during processing). Once the offset is determined, the offset information may be provided to the tool to allow subsequent substrates to be centered over the chuck's process center (as opposed to the chuck's geometric center).

As can be appreciated from the embodiments of the invention, the circular constant etch rate method provides an algorithm for determining a process center for a substrate chuck of a processing chamber. By identifing the process center of a substrate chuck, this method essentially correct the misalignment that may occur, thus reducing the percentage of non-conformity that may happen during substrate processing. Further, by employing current metrology tools to collect pre and post-processing measurements, this method does not require additional expensive purchases to accomplish since metrology tools are commonly available in most fabs. In addition, this method allows for a more accurate characterization of chamber performance during etching by removing the substrate differences from the equation.

Another issue facing users in the prior art is fault detection. A plurality of semiconductor devices may be created from one substrate. To assure the quality of the devices, the substrate may be measured periodically throughout processing.

Generally, fault detection is an integral part of substrate processing. As discussed herein, fault detection refers to the process of identifing defects in a substrate and/or a substrate process. Example of fault detections may include, but are not limited to, identifing misalignment, identifing defects on the substrate, identifing defects in substrate processing, and identifing film clearance.

Figure 8:
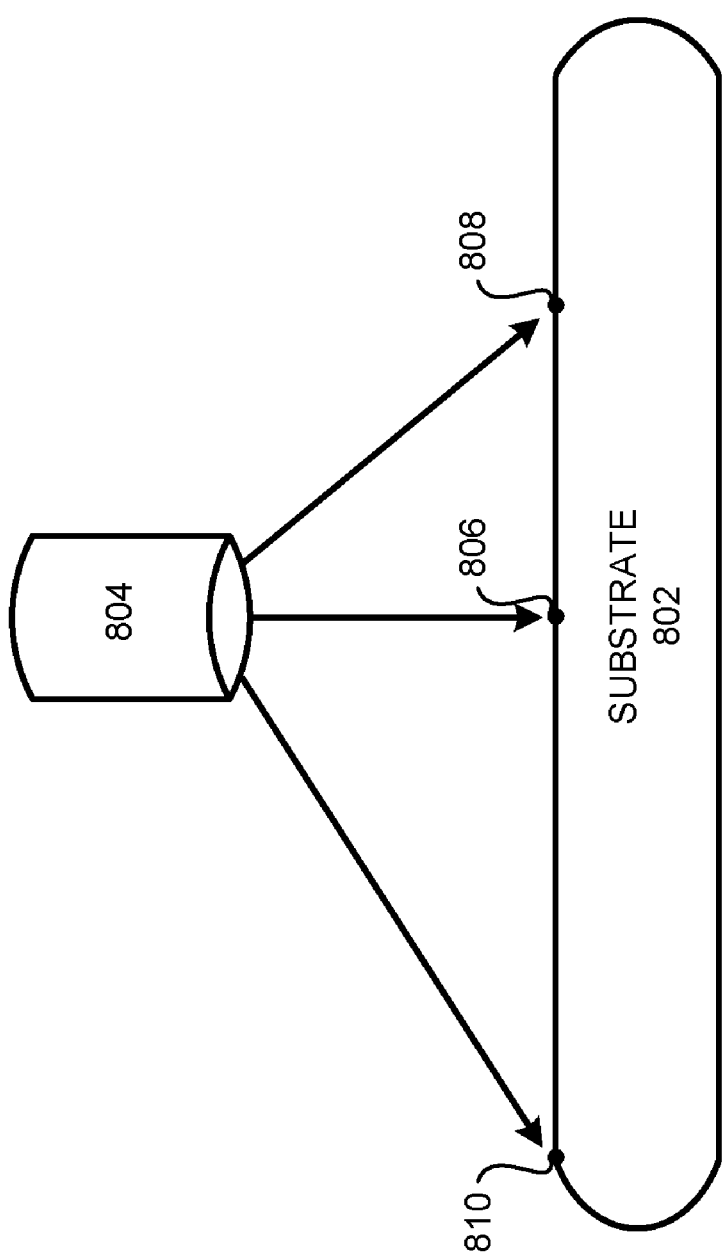
FIG. 8 shows a block diagram of a substrate being measured by an optical metrology tool.

There are various methods for performing fault detections in the prior art. In an example, optical metrology tool may be employed to produce images of the substrate which may allow defects on the substrate to be identified. FIG. 8 shows a block diagram of a substrate being measured by a prior art optical metrology tool. Consider the situation wherein, for example, a substrate 802 has been processed. To perform fault detection, an optical metrology tool 804 may be employed. In capturing images, optical metrology tool 804 may be dependent upon light to be reflected from a surface to capture a satisfactory image of substrate 802.

In an example, at points 806 and 808, optical metrology tool 804 may be able to take satisfactory images of the substrate because light tends not to bounce in multiple directions when light is being reflected from a flat surface. However, since light bounces off a non-flat (e.g., curved or angled) surface in multiple directions, optical metrology tool 804 may have more difficulty capturing the images of the substrate along the substrate edge (point 810).

To capture images of a substrate edge, electron microscopy may be employed. However, electron microscopy is an expensive technique for capturing images of a substrate, requiring an expensive tool and a high level of technical expertise to accomplish.

First, an electron microscopy requires the substrate to be viewed in vacuum since the electron microscopy tends to be a sensitive instrument that may be affected by other electrons. In addition, due to the sample size limitation, electron microscopy usually requires the substrate to be broken down into smaller pieces. As a result, the electron microscopy is not usually used as an inline metrology tool during substrate processing. Although an electron microscopy may be large enough to accommodate the entire substrate, the cost of ownership can be extremely expensive. In addition, electron microscopy generally requires special preparation that may impact the composition of a substrate.

In the prior art, substrate processing has generally been performed away from the edges of a substrate. Thus, the inability of optical metrology tools to capture satisfactory images along the edges of the substrate has not posed a problem. However, precious real estate on the substrate has been sacrificed due to the inability to control the processing along the edges of the substrate. In recent years, new tools are focusing on processing along the edges of the substrate. However, prior art metrology tools and methods are not sufficient to provide the types of images that may enable fault detections to be performed for this type of tools.

In accordance with embodiments of the present invention, there is provided a bevel inspection module (BIM) for capturing clear and sharp images at a substrate edge. In embodiments of the invention, a BIM may include hardware which may create an environment which is more conducive to the capture of satisfactory images of bevel edges of substrates. Embodiments of the invention also include manipulating the images to perform fault detections for processing area encompassing substrate edges.

Consider the situation wherein, for example, a substrate is being processed along or close to the edges. By processing along the edges of the substrate, the real estate of a substrate may be maximized. However, maximization may only occur if processing is achieved with substantially no defect. In the prior art, the area around the edges of a substrate has generally been sacrificed because fault detections have been difficult to implement.

Embodiments of the invention provide a bevel inspection module (BIM) to capture images (e.g., along the edges of a substrate) that have been difficult to capture in the prior art. In one aspect of the invention, the inventors herein realized that to create such an environment, the various components of the BIM need to have the flexibility to capture images at different views and angles. In an embodiment, hardware such as camera, optics enclosure, camera mount, and the like, have been implemented with adjustable positioning capability, thus providing flexibility in the positioning of the hardware. In another example, the inventors herein realized that insufficient lighting has prevented the ability to capture clear and sharp images. In an embodiment, the BIM provides additional lighting (e.g., backlighting), thus providing contrast between the background and the substrate.

The BIM is, in an embodiment, a stand-alone tool that may be attached to a plasma processing system. By attaching the BIM to the plasma processing system, the BIM may be employed as an inline metrology tool during substrate processing.

Figure 9:
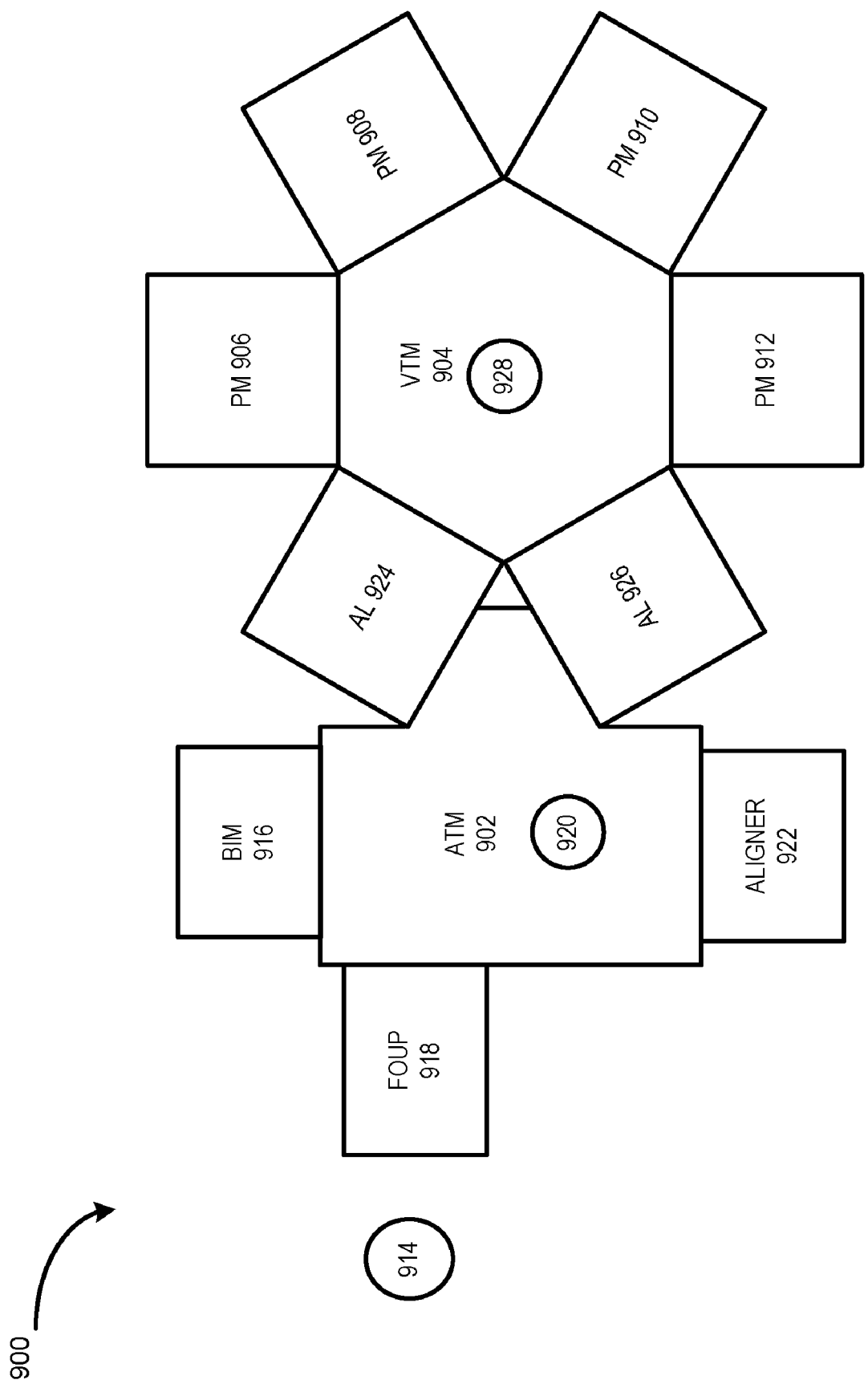
FIG. 9 shows, in an embodiment, a block diagram of an overview of a plasma processing system with a bevel inspection module (BIM).

The features and advantages of the invention may be better understood with reference to the figures and discussions that follow. FIG. 9 shows, in an embodiment, a block diagram of an overview of a plasma processing system with a bevel inspection module (BIM). In this document, various implementations may be discussed using a plasma processing system. This invention, however, is not limited to a plasma processing system and may be employed with any processing system that may want to view bevel edges.

A plasma processing system 900 may include a plurality of substrate-holding locations that enable a substrate to be processed as it moves from an atmospheric transfer module 902 to a vacuum transfer module 904 to one or more process modules (906, 908, 910, and 912) and ultimately back out of plasma processing system 900.

Substrate 914 may be placed on a front opening unified pod (FOUP) 918. A robotic arm 920 within atmospheric transfer module 902 may move substrate 914 to an aligner 922. At aligner 922, substrate 914 may be centered properly. Once centered, robotic arm 920 may move substrate 914 to a BIM 916. In an embodiment, BIM 916 may include an aligner. If the aligner is included as part of the BIM then aligner 922 may be unnecessary.

In BIM 916, pre-processing images may be taken of substrate 914. Once BIM 916 has completed taken the pre-processing images, robotic arm 920 may move substrate 914 to one of the airlock modules (AL 924 and AL 926). The ability of the airlock modules to match the environment between atmospheric transfer module 902 and vacuum transfer module 904 allows substrate 914 to move between the two pressurized environments without being damaged.

From an airlock module, such as AL 924, substrate 914 may be moved into one of the process modules (906, 908, 910, and 912) by a robotic arm 928 within vacuum transfer module 904. During processing, substrate 914 may be analyzed periodically. In an example, after processing has been completed in process module 906, robotic arm 928 may transfer substrate 914 from process module 906 through vacuum transfer module 904 through AL 924 to robotic arm 920. Robotic arm 920 may move substrate 914 to BIM 916 for performing inline inspection. Once inspection has been completed, substrate 914 may be moved back into one of the processing modules to continue processing. Since BIM 916 may be connected to plasma processing system, inline metrology may be performed periodically throughout the processing to enable an operator to perform analysis on substrate 914.

In an embodiment, BIM 916 may be disconnected from plasma processing system 900. Although BIM 916 may still be able to provide the same support as though it was connected, additional steps may have to be performed. By having BIM 916 connected to plasma processing system 100, inline metrology may be performed without manual interference.

Figure 10:
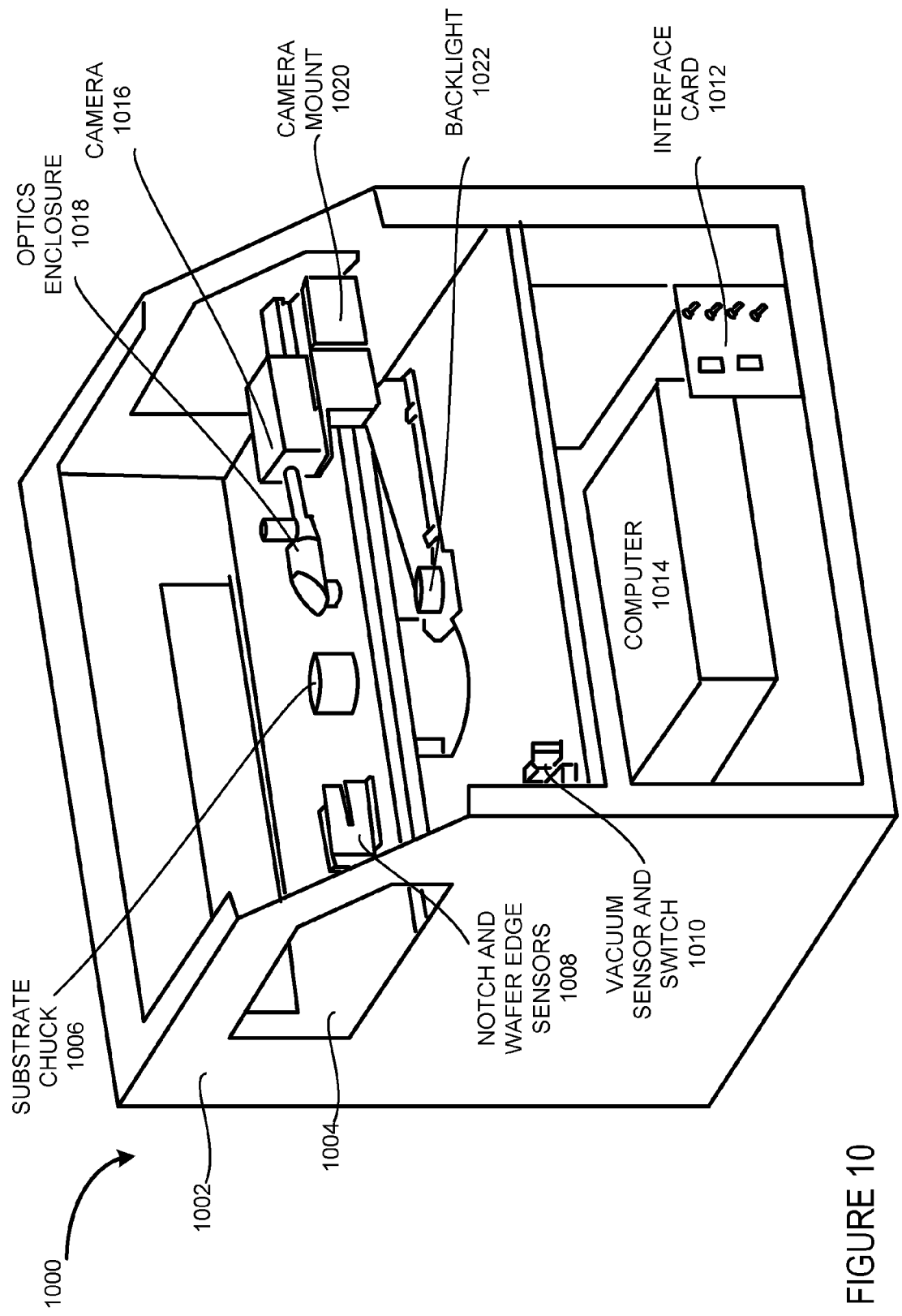
FIG. 10 shows, in an embodiment, a system diagram of a BIM.

FIG. 10 shows, in an embodiment, a system diagram of a BIM. A BIM 1000 may have an enclosure 1002, which may enable BIM 1000 to be mounted directly to an atmospheric transfer module. By being directly connected to the atmospheric transfer module, BIM 1000 may enable inline metrology to occur during substrate processing, in an embodiment.

BIM 1000 may have a fly opening 1004, from which substrate may be placed onto a substrate chuck 1006. BIM 1000 may also include notch and wafer edge sensors 1008, which may be capable of identifing the substrate and the substrate notch. Notch and wafer edge sensors 1008 may behave similar to aligner 922 of FIG. 9. If notch and wafer edge sensors 1008 is included in BIM 1000, then an aligner may be an optional module.

BIM 1000 may also include a vacuum sensor and switch 1010, which may identify when a substrate is disposed on top of substrate chuck 1006. In an example, when vacuum sensor and switch 1010 is in an "on" position, then the substrate is firmly attached to substrate chuck 1006 and a robotic arm is prevented from removing the substrate. When vacuum sensor and switch 1010 is in an "off" position, the robotic arm is able to remove the substrate from BIM 1000.

BIM 1000 may also include an interface card 1012, which is an input/output board. Interface card 1012 may act as a controller of the electronics that may be utilized by BIM 1000. BIM 1000 may also include a computer 1014, which may be connected to interface card 1012.

BIM 1000 may also include a camera 1016 and an optics enclosure 1018, which enable images to be taken. Optics enclosure 1018 may be extended from camera 1006. Camera 1016 and optics enclosure 1018 are mounted on a camera mount 1020. BIM 1000 may also include a backlight 1022, which provides lighting to the background.

Figure 11:
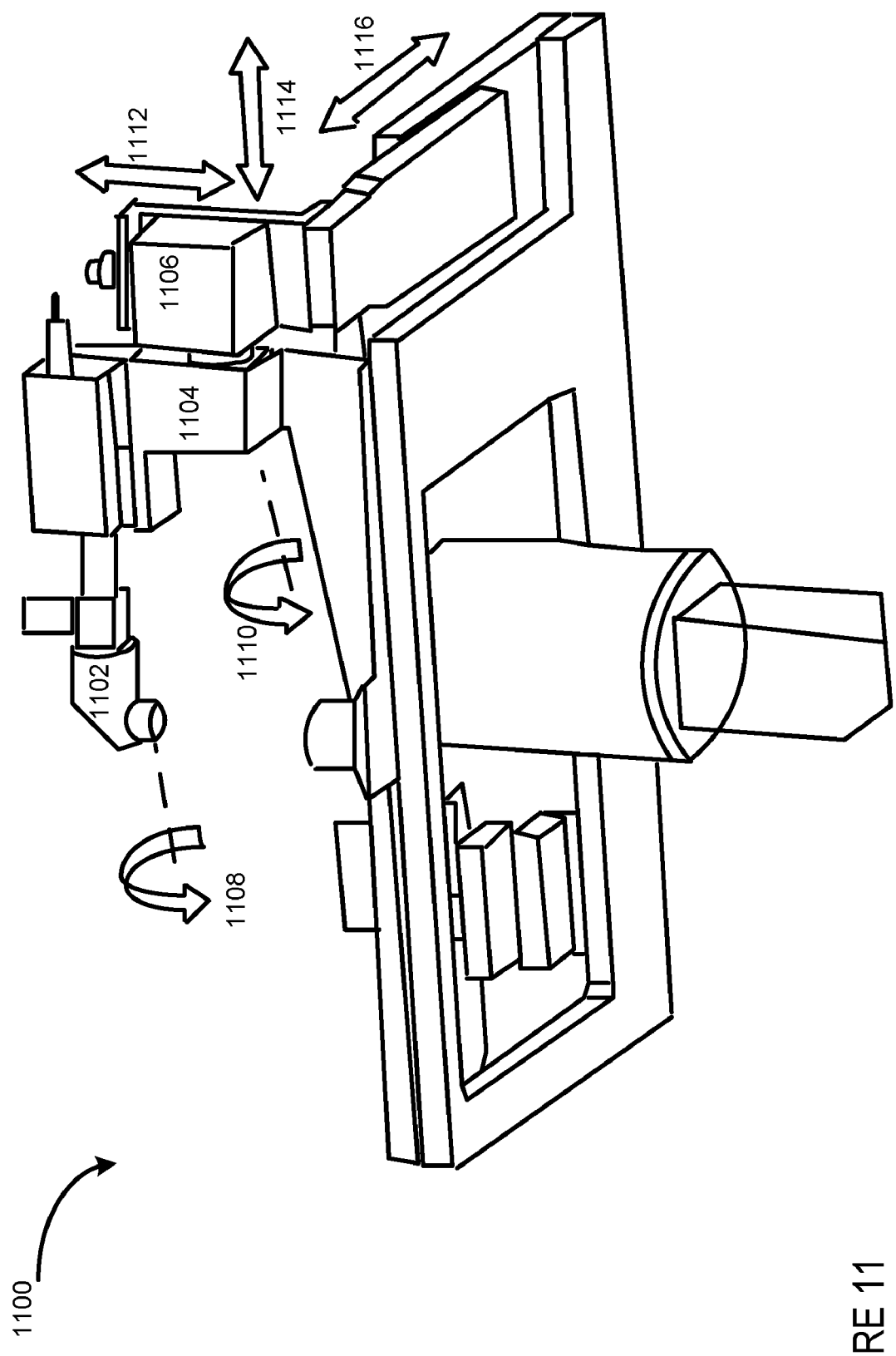
FIG. 11 shows, in an embodiment, a system diagram of a close-up view of a camera and optics enclosure on a camera mount.

FIG. 11 shows, in an embodiment, a system diagram of a close-up view of a camera and optics enclosure on a camera mount. A BIM 100 may include an optic enclosure 1102, which may be extended from a camera 1104. Camera 1104 may be attached to a camera mount 1106.

In an embodiment, camera mount 1106 may be extended in and out in the direction as shown by arrow 1116. By adjusting camera mount 1106, the position of camera 1104 and optics enclosure 1102 may be corrected to account for the size of the substrate and/or the size of the substrate area being analyzed. In an example, camera mount 1106 may have to be adjusted as the size of the substrate changes from 200 millimeters to 300 millimeters.

In an embodiment, camera 1104 may be moved in a vertical direction as shown by arrow 1112, enabling camera 1104 to capture images at different ranges. In another embodiment, camera 1104 may be moved in a lateral direction as shown by arrow 1114, enabling camera 1104 to further adjust for the size of the substrate and/or the size of the substrate area being analyzed. In yet another embodiment, camera 1104 may rotate as shown by arrow 1110 enabling camera 1104 to capture different views (e.g., top, bottom, and side) of the substrate. In an example, camera 1104 may be adjusted to capture a top view of the substrate. In another example, camera 1104 may be adjusted to capture a direct view of the bevel edge (e.g., side view) of the substrate.

In an embodiment, optics enclosure 1102 may also be adjusted. In an example, optics enclosure 1102 may rotate as shown by arrow 1108 enabling optics enclosure to provide lighting at different angles.

The ability of camera 1104, optics enclosure 1102, and camera mount 1106 to be adjusted provides BIM 1100 with the flexibility to capture images at different angles, ranges, and positions. Thus, controls of the type of images that may be captured may be refined. As aforementioned, the hardware of the BIM have been implemented with adjustable parts, thus providing flexibility in the positioning of the hardware.

Figure 12:
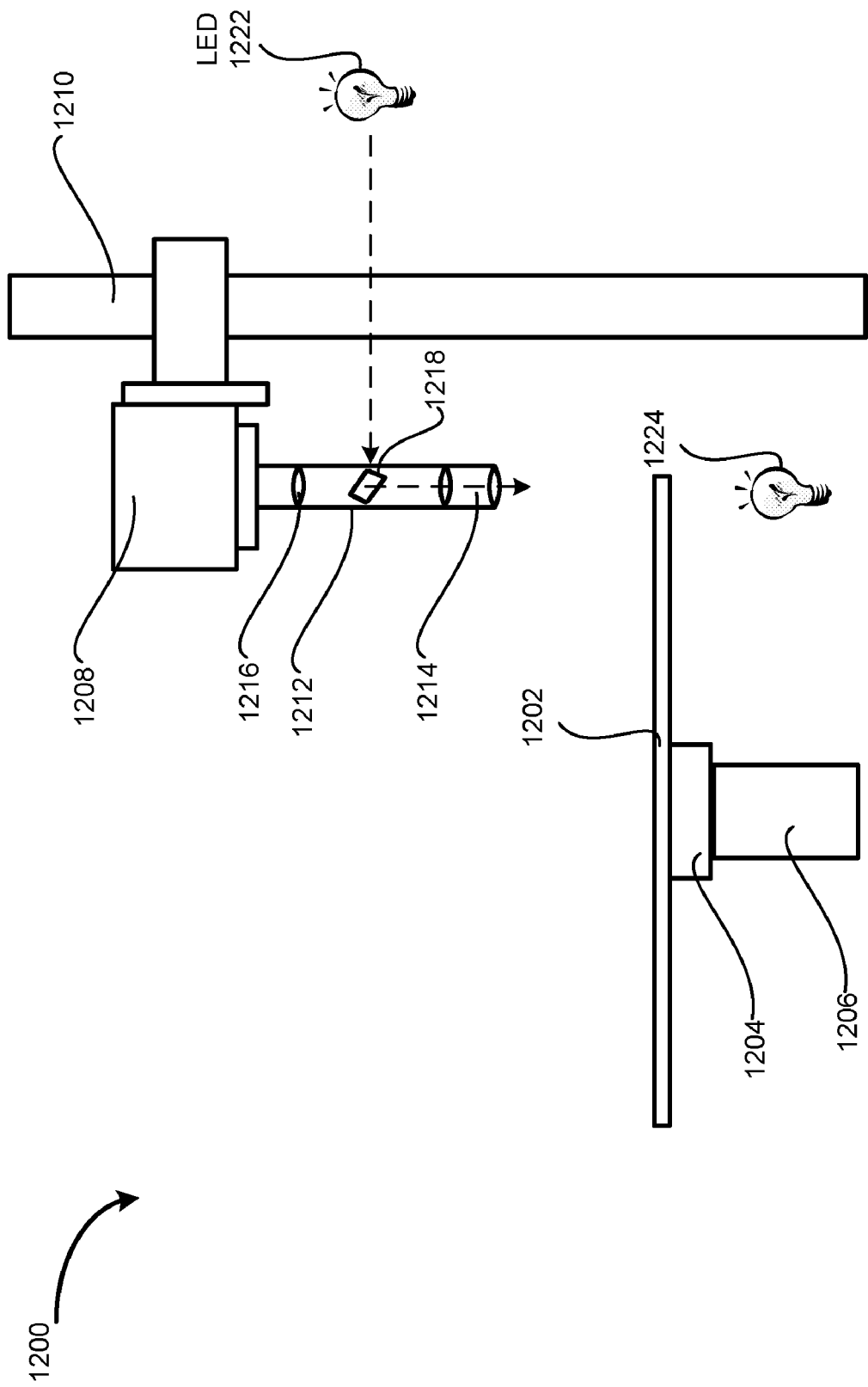
FIG. 12 shows, in an embodiment, a cross-sectional view of a BIM.

FIG. 12 shows, in an embodiment, a cross-sectional view of a BIM. Consider the situation wherein, images of a substrate are being taken. A BIM 1200 may include a substrate 1202 placed on top of a substrate chuck 1204. Substrate chuck 1204 may be connected to a rotational motor 1206, which may enable substrate 1202 to be rotated. The ability to rotate may allow substrate chuck 1204 to move substrate 1202 into position for a camera 1208 to capture images of substrate 1202 to capture images at different locations of substrate 1202.

BIM 1200 may also include a camera mount 1210. Attached to camera mount 1210 may include camera 1208 and an optics enclosure 1212. Optics enclosure 1212 may include a lens 1214, lens 1216, and a beam splitter 1218.

Lighting may be provided by a light 1222. In an embodiment, light 1222 may be a light-emitted diode (LED). In an embodiment, light 1222 may be a three wavelength LED. By having a plurality of wavelengths, the illumination may be changed as film thickness, profile, and/or index is change. In an example, to capture images of film with higher index, a shorter wavelength LED may be utilized. Light 1222 may flow from the outside into optics enclosure 1212 via beam splitter 1218, which may direct light 1222 downward towards lens 1214.

To increase the contrast between a substrate edge and the background, a backlight 1224 may be provided. Since a substrate may have bevel edges which may be rounded, light may bounce off the substrate, preventing a good image to be captured. In the prior art, no backlight may be provided, resulting in images in which the edges of a substrate may not be clearly defined. In an embodiment, BIM 1200 may include backlight 1224, which may help accentuate the edge of substrate 1202. By adding backlight 1224, contrast is provided between the edges of the substrate and the background. In other words, the edges of substrate 1202 may be illuminated enabling camera 1208 and optics enclosure 1212 to capture images of the edges of substrate 1202 that clearly separate the edges of the substrate from the background.

In an embodiment, the field of view of lens 1214 may be changed to increase or decrease the area being photographed by camera 1208. In addition, lens 1214 magnification may be changed. In an example, shorter wavelength LED may require a higher magnification in order to produce a clear image.

FIGS. 10, 11, and 12 show different views of a BIM. As can be seen, embodiments of the BIM provide an environment that is conducive to providing clear and sharp images that may be employed in fault detection. In an example, the BIM includes components that have the flexibility to be adjusted, to be moved, and/or to be rotated; thus, enabling the camera, optics enclosure, and substrate to be positioned such that clear images may be captured. Further, additional lightings may be provided, thus, enabling images that show contrast between the edges of a substrate and a background to be taken.

With the BIM, cleaner and sharper images may be produced allowing for fault detections to occur along the edges of a substrate. The next few figures will show how images captured by a BIM may be utilized to perform fault detections.

Figure 13:
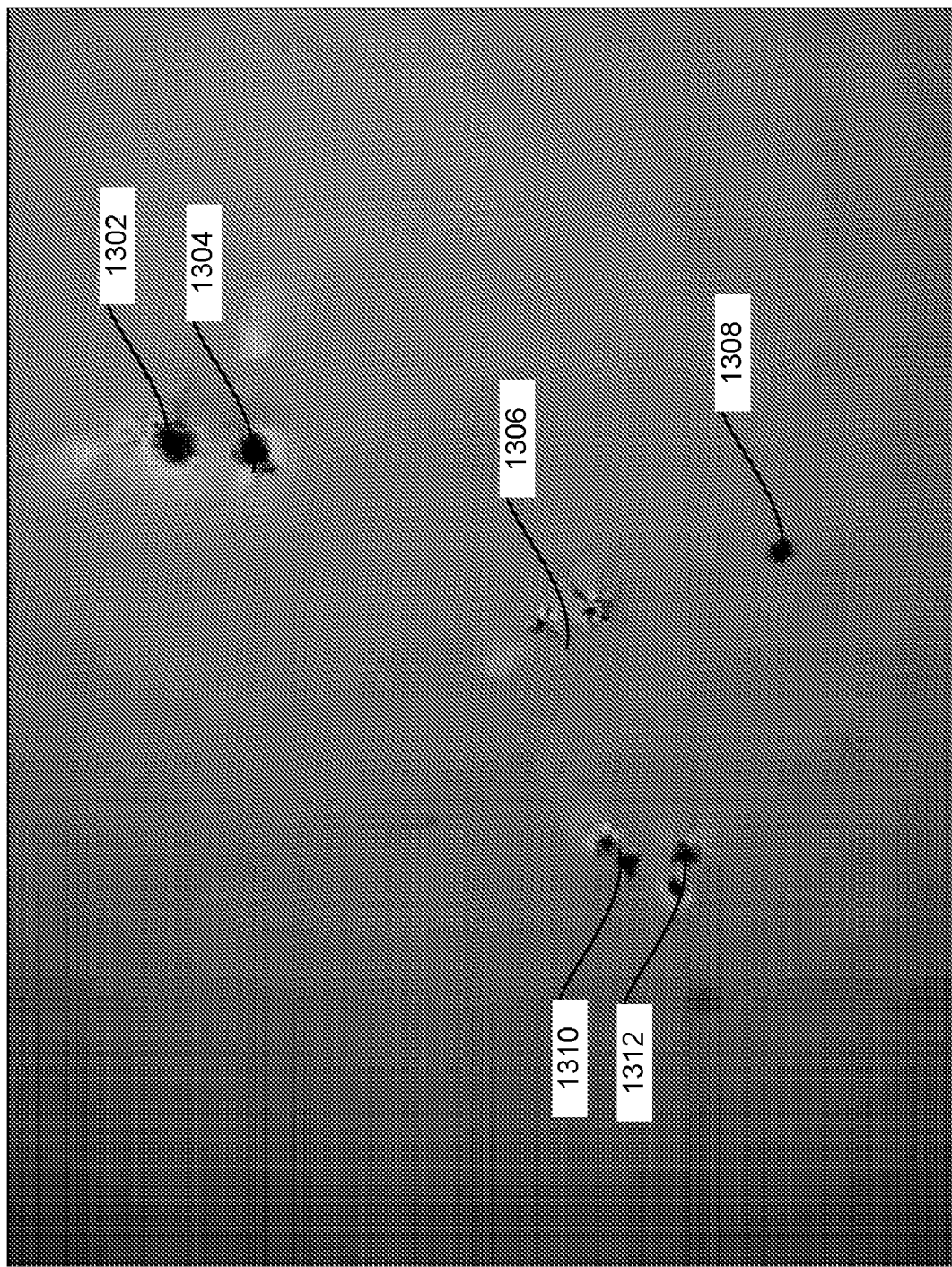
FIG. 13 shows, in an embodiment, an example of an image captured by a BIM that shows arcing occurring along the edges of a substrate.

In an embodiment, due to the clarity of images that may be produced by a BIM, defects along the edges of a substrate may now be detected. FIG. 13 shows, in an embodiment, an example of an image captured by a BIM that shows arcing occurring along the edges of a substrate. Image 1300 shows pit marks 1302, 1304, 1306, 1308, 1310, and 1312, which may be examples of arcing that may occur during processing. In the prior art, optical metrology tools may be employed to capture images of arcing that may be occurring away from the edges of a substrate. However, prior art optical metrology tools generally do not have capability to capture clear images along the substrate edges. In order to identify defects, such as arcing, that may be occurring during substrate processing along the edges, BIM may be employed to capture sharp clear images of the edges of the substrate.

Figure 14:
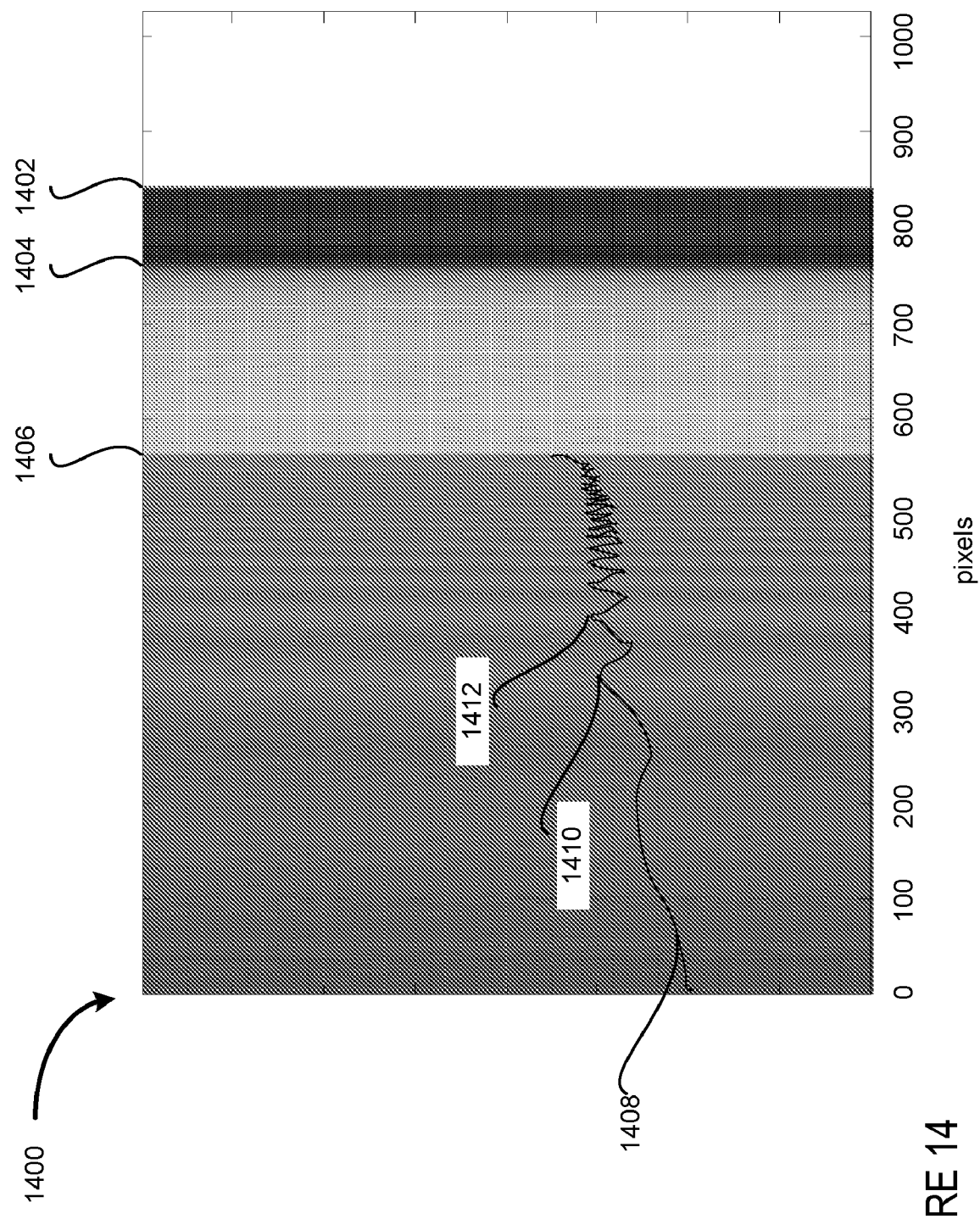
FIG. 14 shows, in an embodiment, an example of an image produced by BIM that may be utilized in identifing misalignment.

FIG. 14 shows, in an embodiment, an example of an image produced by BIM that may be utilized in identifying misalignment. Image 1400 shows an image of an area of a substrate edge. A line 1402 may represent the edge of a substrate. A line 1404 may represent the last point at which the substrate may be flat. A line 1406 may represent the point where the film layer has been totally removed. Curve 1408 may represent the plurality of interference fringes (e.g., 1410, 1412) that may occur during processing. Each interference fringe may represent the distance from the edge of a substrate in which the etch rate may be constant.

If the distance from line 1406 to line 1402 is substantially the same at different orientations ($\theta$), then the substrate is substantially centered in the processing chamber and misalignment is minimal or substantially zero. However, if the distance from edge of substrate, which is from line 1402 to line 1406, is not the same at different orientations ($\theta$), then misalignment may exist. By plotting a plurality of distances from edge of substrate versus orientations ($\theta$), an off-centered plot may be created. If additional off-centered plot is desired, then line 1406 may be replaced by one of the interference fringes. In an example, an off-centered plot may be created for a plurality of distances from the edge of a substrate from line 1402 to interference fringe 1412.

Figure 15:
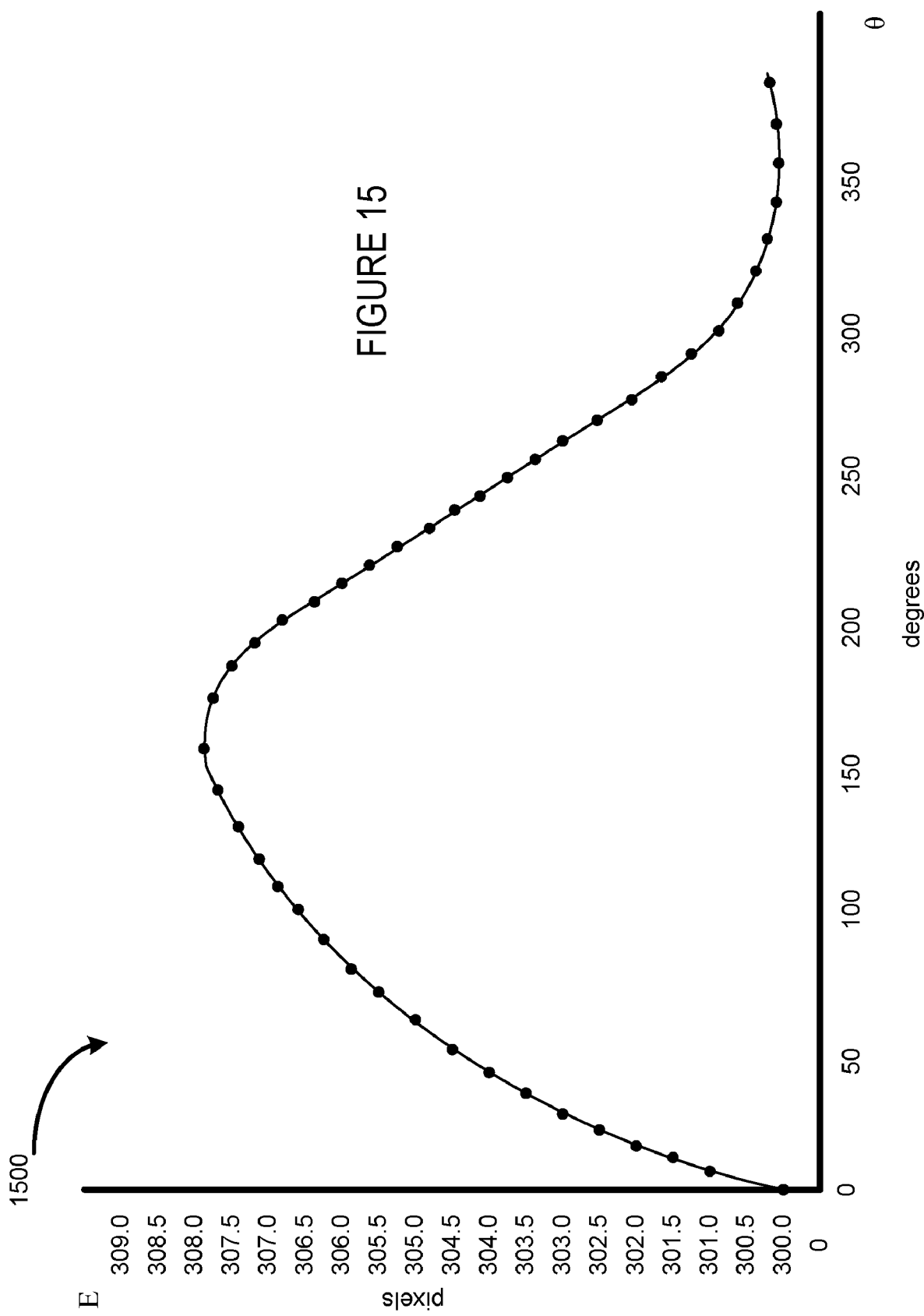
FIG. 15 shows, in an embodiment, a simple graph illustrating distance from center versus orientation of a constant etch rate.

FIG. 15 shows, in an embodiment, a simple graph illustrating an off-centered plot (i.e., distance from center versus orientation of a constant etch rate).

A graph view 1500 shows a plurality of distances from edge of substrate (E) plotted versus a plurality of orientations ($\theta$). As can be seen, FIG. 15 is similar to FIG. 5. The main difference is that in FIG. 15, the distance is from the edge of a substrate instead of from the center of a substrate. For each interference fringe, an off-centered plot may be plotted. The off-centered plot, in an embodiment, may have a substantially sinusoidal shape. In an embodiment, a process center may be calculated from at least one off-centered plot.

Once an off-centered plot has been plotted, a curve-fitting equation (e.g., Fourier Series Equation from Fourier Transform, Least Square Fit, etc.) may be employed to determine the parameters for Equation 2.

$$E_n(\theta)=E_{avg}+\Delta c\cos(\theta-\phi_1)+\Delta c_2\cos(2\theta-\phi_2) \quad \text{[EQUATION 2]}$$

| Parameter | Description |
|---|---|
| $E_{avg}$ | average distance from edges of a substrate for a interference fringe |
| $\Delta c\cos(\theta-\phi_1)$ | first harmonics - deviation as a function of an orientation |
| $\Delta c_2\cos(2\theta-\phi_2)$ | second harmonics |
| $\Delta c$ | distance measurement between 2 centers |
| $\theta$ | orientation |
| $\phi$ | angle of which the offset is in |

Figure 16:
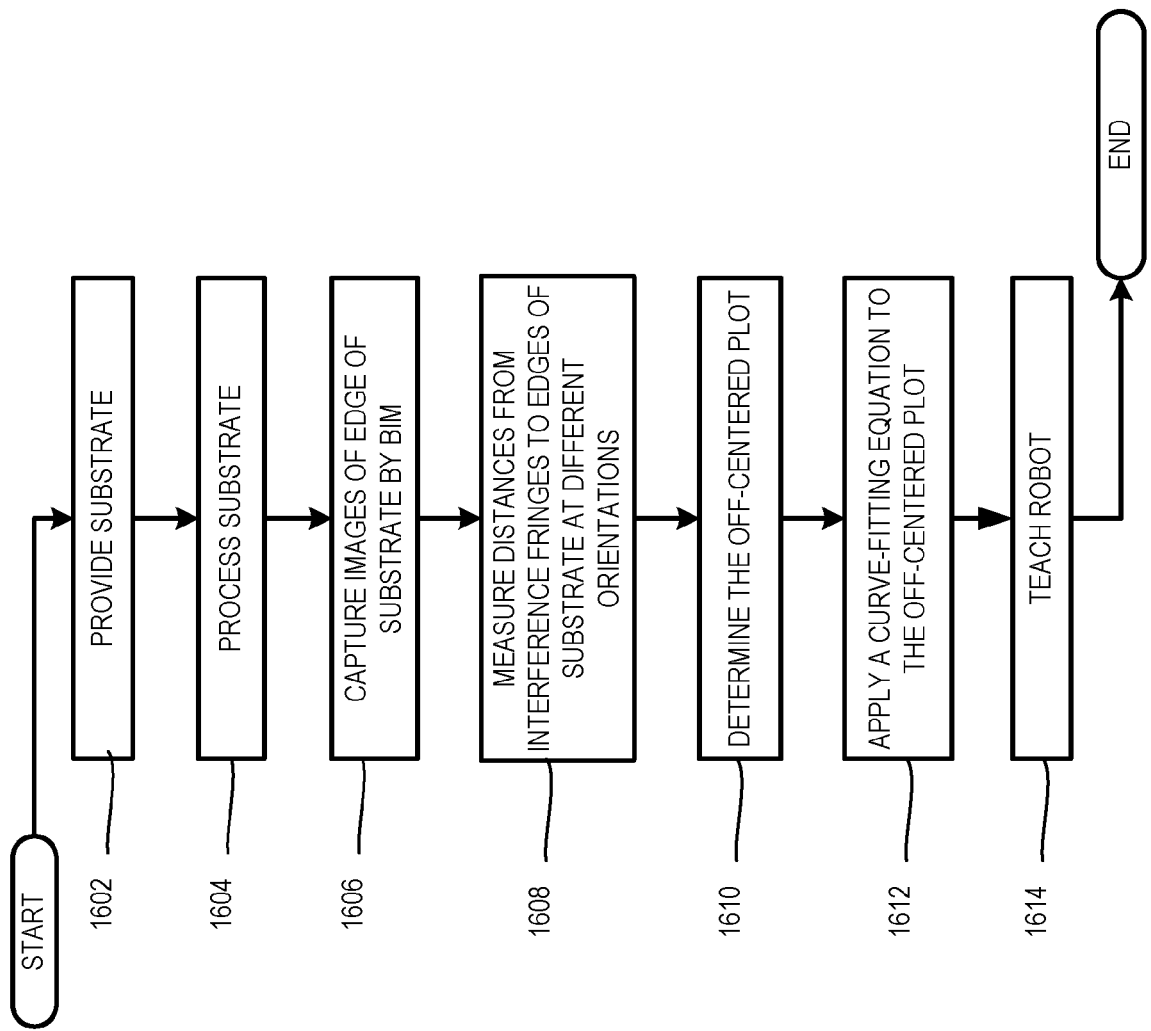
FIG. 16 shows, in an embodiment, a simple flow chart illustrating the steps for calculating a process center for a substrate chuck utilizing images captured by a BIM.

FIG. 16 shows, in an embodiment, a simple flow chart illustrating the steps for calculating a process center for a substrate chuck utilizing images captured by a BIM.

At a first step 1602, a substrate is provided. In an embodiment, the substrate may have a film layer (e.g., refractive film layer).

At a next step 1604, an area at the edges of the substrate may be processed in a plasma processing chamber. In an example, the area that may be processed does not include the substrate section that is beyond 3 millimeters from the edges of the substrate.

Once the substrate has been removed from the plasma processing chamber, at a next step 1606, the BIM may capture a plurality of images of the processed area of the substrate.

At a next step 1608, a plurality of distances from the edges of the substrate for an interference fringe may be measured at different orientations.

At a next step, 1610, the plurality of distances from the edges of the substrate may be plotted against the orientations ($\theta$) to create an off-centered plot. An off-centered plot may be plotted for each interference fringe, although a substrate offset may be determined by one off-centered plot.

At a next step 1612, a curve-fitting equation (e.g., Fourier Series Equation from Fourier Transform, Least Square Fit, etc.) may be employed to determine the parameters for the substrate offset. Those skilled in the art are familiar with curve-fitting equation. As a result, no further discussion will be provided. Once the parameters have been determined for the above Equation 2, at a final step 1614, the parameters may be taught to a robotic arm in a transfer module (e.g., vacuum transfer module, atmospheric transfer module, and the like). As a result, the robotic arm may now have the correct coordinates to offset a substrate on a substrate chuck such that the substrate may be guided into the process center of the substrate chuck.

Figure 17:
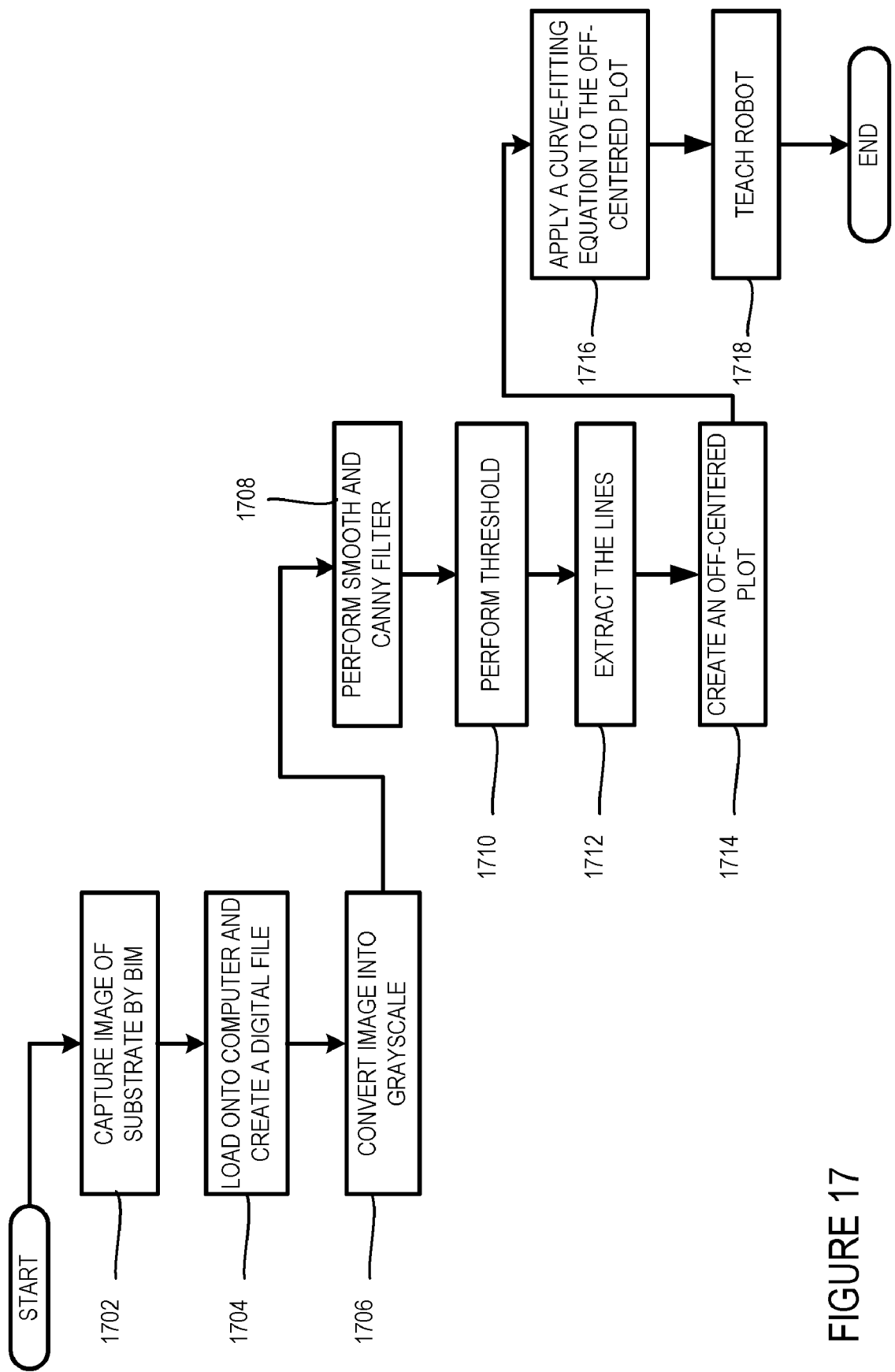
FIG. 17 shows, in an embodiment, an image processing flowchart for manipulating images that are captured by a BIM for performing fault detection.

FIG. 17 shows, in an embodiment, an image processing flowchart for manipulating images that are captured by a BIM for performing fault detection.

At a first step 1702, a BIM may capture an image of a substrate. In an embodiment, the image may be in color.

At a next step 1704, the image may be uploaded onto a computer system and a digital file of the image may be produced.

At a next step 1706, the image may be converted into a grayscale image, which is usually an 8 bits image.

At a next step 1708, smooth and canny may be performed. Smooth and canny refers to a filtering technique in which noises may be removed from the image and edges of the image may be accentuated.

Figure 18:
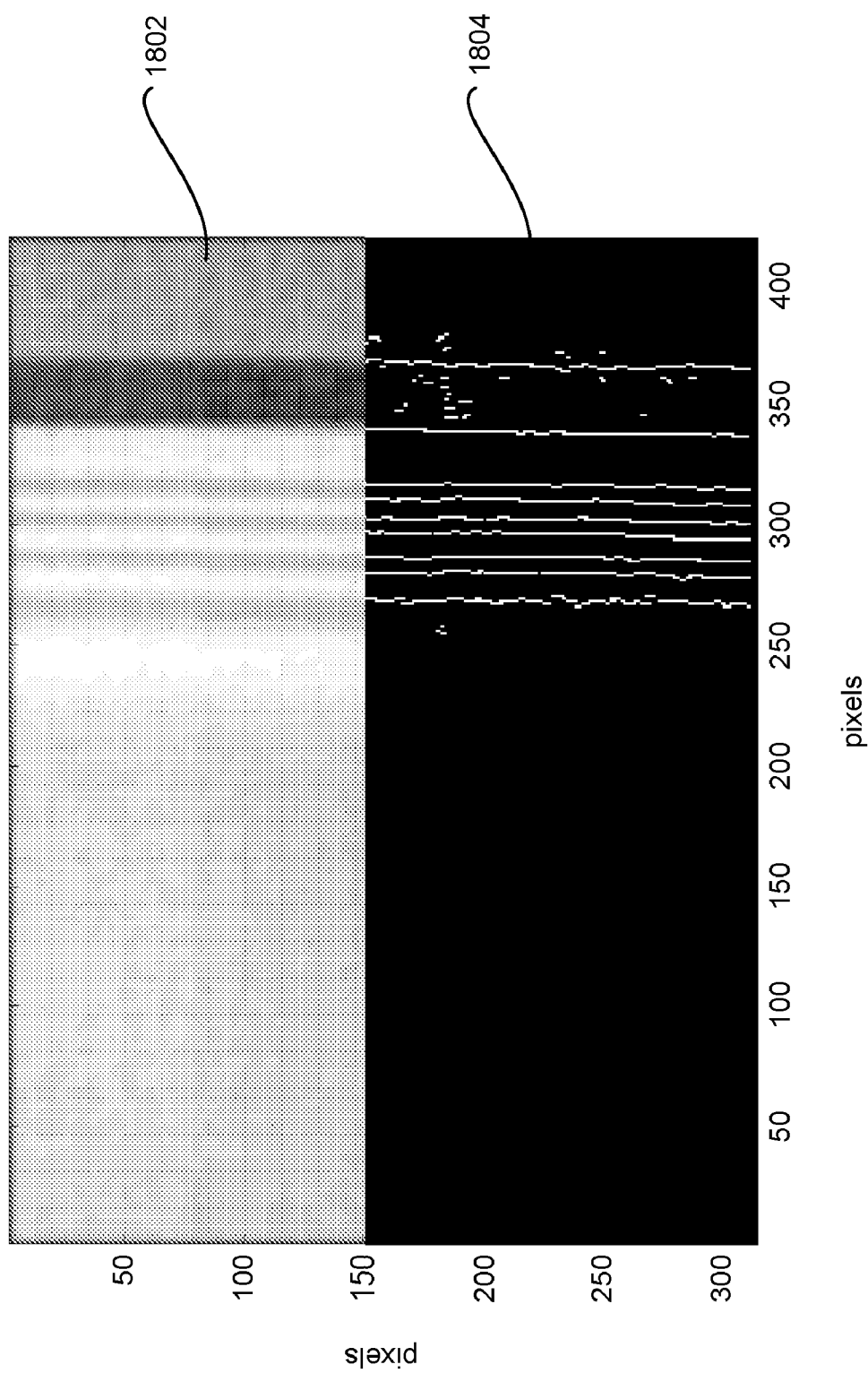
FIG. 18 shows, in an embodiment, an example of an image captured by a BIM that shows threshold.

At a next step 1710, threshold may be performed. Threshold refers to converting the image from an 8 bits image to a 1 bit image. In other words, only the edges of the image may now be seen. See FIG. 18 for an example of an image captured by a BIM that shows threshold. Area 1802 may represent an image of a substrate prior to processing. Area 1804 may represent an image of a substrate after threshold has been performed. As can be seen from the image, all but the edges of the interference fringes, film thickness, and bevel edges may be eliminated. In an embodiment, additional filtering may be performed to remove additional noises that may exist in the image until only the lines for the bevel edge and the first interference fringe remains.

At a next step 1712, the line may be extracted and the gap may be calculated to determine the distance from the edge of the substrate. As discussed herein, the gap refers to the distance between the edge of a substrate and the first interference fringe. Steps 1702 through 1712 may be repeated for images at different orientations. In an embodiment, the gap data may be extracted for at least four different orientations.

At a next step 1714, the plurality of gaps may be plotted against the orientation to create an off-centered plot, which may be a sinusoidal curve.

At a next step 1716 a curve-fitting equation (e.g., Fourier Series Equation from Fourier Transform, Least Square Fit, etc.) may be employed to determine the parameters for the substrate offset.

At a final step 1718, the parameters for an adjusted process center may be taught to a robotic arm in a transfer module (e.g., atmospheric transfer module, vacuum transfer module, etc.).

Figure 19:
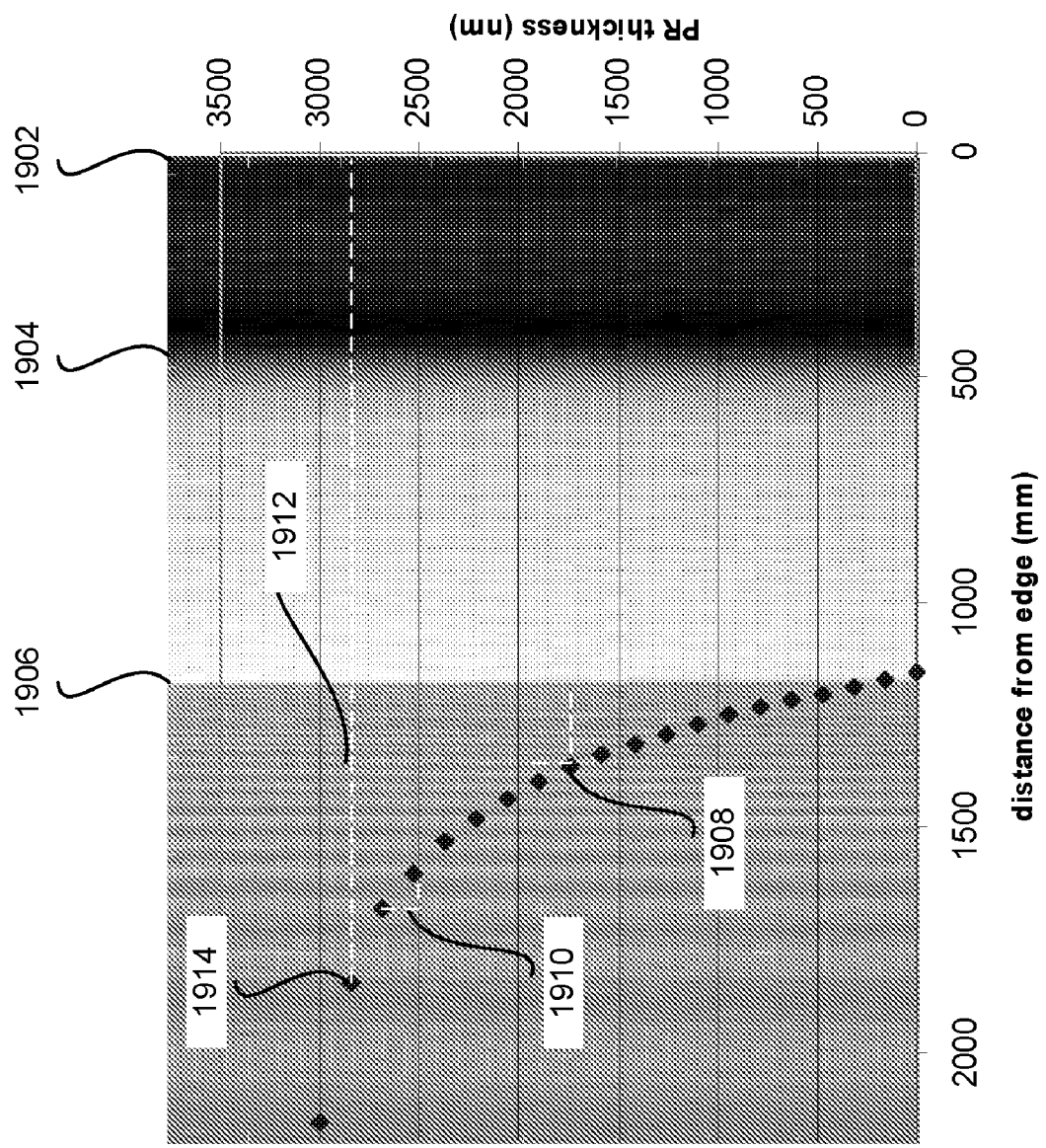
FIG. 19 shows, in an embodiment, an example of an image of a substrate with interference fringes that is captured by a BIM.

FIG. 19 shows, in an embodiment, an example of an image of a substrate with interference fringes that is captured by a BIM. A line 1902 may represent the edge of a substrate. From a line 1904 to a line 1906, the film layer may have been cleared during processing. Curve 1908 may represent the plurality of interference fringes that may occur during processing. As discussed herein, interference fringe refers to the maxima or the minima of the amplitude of reflective light. Equation 3 below may be utilized to calculate the thickness between two consecutive interference fringes.

$$\Delta t = \lambda/2n \quad \text{[Equation 3]}$$

| Parameter | Description |
|---|---|
| $\Delta t$ | Changes between two consecutive interference fringes |
| $\lambda$ | Wavelength |
| n | Index of the film |

The thickness change in two consecutive interference fringes may be calculated because both the wavelength and the index are known variables. The wavelength is associated with the wavelength of the LED that may be employed to capture the image in a BIM. The index of the film is known and is dependent upon the type of film that may be applied to a substrate. In an example, the wavelength is 500 nanometers and the index is 2.5. The thickness change for this example is 100 nanometers. In other words, the thickness between interference fringes (1910) is 100 nanometers each.

For each interference fringe, a distance from the edge of the substrate may be calculated. In an example, a distance from the edge of the substrate (1912) for an interference fringe 1914 is about 1875 millimeter. Thus, curve 1908 may represent a thickness profile for the substrate at a specific orientation.

In an embodiment, the thickness profile may be converted into an etch depth profile. Since the thickness of the film layer is known, the thickness change ($\Delta t$) may be subtracted from the original film thickness to determine the etch depth. For each thickness change, an etch depth may be calculated. Once the etch depths have been identified, the aforementioned inventive circular constant etch method may be employed to determine the substrate offset and ultimately the process center of a substrate chuck for a processing chamber.

As can be appreciated from embodiments of the invention, the BIM provides an inline inspection tool that is capable of capturing clear and sharp images of the bevel edges of a substrate without sacrificing the substrate. With clear and sharp images, fault detections may be performed along the bevel edge, allowing misalignment and defects in the substrate to be identified and resolved. In addition, the ability to perform fault detection enables better control of the processing that may occur along the edges of a substrate. Further, by eliminating the substrate from the equation, a more accurate characterization of chamber performance may be achieved.

While this invention has been described in terms of several embodiments, there are alterations, permutations, and equivalents, which fall within the scope of this invention. Also, the title, summary, and abstract are provided herein for convenience and should not be used to construe the scope of the claims herein. Further, in this application, a set of "n" refers to zero or more "n" in the set. It should also be noted that there are many alternative ways of implementing the methods and apparatuses of the present invention. It is therefore intended that the following appended claims be interpreted as including all such alterations, permutations, and equivalents as fall within the true spirit and scope of the present invention

What is claimed is:

1. A bevel inspection module for capturing images of a substrate, comprising:
    a substrate chuck for supporting said substrate;
    a rotational motor, said substrate chuck being attached to said rotational motor, said rotational motor being configured to rotate said substrate chuck thereby allowing said substrate to revolve;
    a camera;
    an optics enclosure, said optics enclosure being attached to said camera, said optic enclosure being configured to rotate, enabling light to be directed toward said substrate;
    a camera mount, said camera being installed onto said camera mount, said camera mount being configured to enable said camera to rotate on a 180 degree plane allowing said camera to capture said images, said images including at least one of a top view, a bottom view, and a side view of said substrate; and
    a backlight arrangement, said backlight arrangement being configured to provide illumination to said substrate, thereby enabling said camera to capture said images, said images showing contrast between said substrate and a background.

2. The bevel inspection module of claim 1 further including an enclosure, said enclosure enabling said bevel inspection module to be attached to a plasma processing system.

3. The bevel inspection module of claim 1 further including notch and wafer edge sensors, said notch and wafer edge sensors being configured to identify, said substrate and a substrate notch.

4. The bevel inspection module of claim 1 further including a vacuum sensor and switch, said vacuum sensor and switch being configured to prevent said substrate from being extracted while said substrate is being inspected.

5. The bevel inspection module of claim 1 wherein said camera mount is configured to be adjustable, thereby enabling said camera mount to be adjusted to account for the size of said substrate.

6. The bevel inspection module of claim 1 wherein said camera is configured to be adjustable in at least one of a vertical direction, a lateral direction, and a rotational direction, thereby enabling said camera to be adjusted to capture said images, said images including said at least one of said top view, said bottom view, and said side view of said substrate.

7. The bevel inspection module of claim 1 wherein said images captured by said camera differentiate edges of said substrate from said background.

8. The bevel inspection module of claim 7 wherein a set of measurement data from said images is extrapolated to identify defects in said substrate.

9. The bevel inspection module of claim 7 wherein a set of measurement data extrapolated from said images is employed to create a film thickness profile.

10. The bevel inspection module of claim 7 wherein a set of measurement data extrapolated from said images is used to identify misalignment.

11. The bevel inspection module of claim 10 wherein said set of measurement data is employed to identify a process center for a chuck of a processing chamber.

12. A method for calculating a process center of a chuck in a processing chamber, comprising:
    capturing images of edges of a processed substrate by employing a bevel inspection module;
    measuring a set of distances from said edges of said processed substrate for an interference fringe, said set of distances being measured at a set of orientations;
    generating an off-centered plot, said off-centered plot being a graphical representation of said set of distances versus said set of orientations; and
    calculating said process center by applying a curve-fitting equation to said off-centered plot.

13. The method of claim 12 further comprising:
    selecting said off-centered plot from a set of off-centered plots; and
    generating said set of off-centered plots for a set of interference fringes.

14. The method of claim 12 further comprising generating a sinusoidal curve as said off-centered plot.

15. The method of claim 12 further comprising using a Fourier Series Equation from Fourier Transform as said curve-fitting equation.

16. The method of claim 12 further comprising using a Least Square Fit on a sinusoid equation as said curve-fitting equation.

17. The method of claim 12 further comprising teaching a robot arm of said processing system the coordinates of said process center.

18. The method of claim 12 further comprising including a refractive film layer in said processed substrate.

19. The method of claim 12 further comprising:
    including a camera in said bevel inspection module;
    attaching said camera to a camera mount;
    configuring said camera mount to enable said camera to rotate on a 180 degree plane, allowing said camera to capture said images of said processed substrate;
    attaching an optics enclosure to said camera;
    configuring said optic enclosure to rotate for enabling light to be directed toward said processed substrate;

attaching a substrate chuck to a rotational motor, thereby enabling said processed substrate to revolve, enabling said camera to capture said images of said edges of said processed substrate; and using a backlight arrangement to provide illumination to said substrate, thereby enabling said camera to capture said images, said images showing contrast between said processed substrate and a background.

20. An image processing method for determining a process center for a chuck in a processing chamber, comprising:

capturing images of a processed substrate by employing a bevel inspection module;

filtering said images to remove noises from said images and to accentuate edges of said processed substrate;

measuring a set of gaps from said edges of said processed substrate for an interference fringe, said set of gaps being measured at a set of orientations;

generating an off-centered plot, said off-centered plot being a graphical representation of said set of gaps versus said set of orientations; and calculating said process center by applying a curve-fitting equation to said off-centered plot.

21. The method of claim 20 further comprising converting said images into grayscale images.

22. The method of claim 20 further comprising using a smooth and canny technique in said filtering.

23. The method of claim 20 further comprising using a threshold technique in said filtering.

24. The method of claim 20 further comprising generating a sinusoidal curve as said off-centered plot.

25. The method of claim 20 further comprising using a Fourier Series Equation from Fourier Transform as said curve-fitting equation.

26. The method of claim 20 further comprising using a Least Square Fit on a sinusoid equation as said curve-fitting equation.

27. The method of claim 20 further comprising teaching a robot arm of said processing system the coordinates of said process center.

28. The method of claim 20 further comprising including a refractive film layer in said processed substrate.

29. The method of claim 20 further comprising:

selecting said off-centered plot from a set of off-centered plots; and generating said set of off-centered plots for a set of interference fringes.

30. The method of claim 20 further comprising:

including a camera in said bevel inspection module;

attaching said camera to a camera mount;

configuring said camera mount to enable said camera to rotate on a 180 degree plane, allowing said camera to capture said images of said processed substrate;

attaching an optics enclosure to said camera;

configuring said optic enclosure to rotate for enabling light to be directed toward said processed substrate;

attaching a substrate chuck to a rotational motor, thereby enabling said processed substrate to revolve, enabling said camera to capture said images of said edges of said processed substrate; and using a backlight arrangement to provide illumination to said substrate, thereby enabling said camera to capture said images, said images showing contrast between said processed substrate and a background.

* * * * *